US012707739B2

(12) United States Patent
Wang et al.

(10) Patent No.: US 12,707,739 B2
(45) Date of Patent: Aug. 11, 2026

(54) DISPLAY PANEL, METHOD OF MANUFACTURING THE SAME AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Xinle Wang, Beijing (CN); Yifan Song, Beijing (CN); Yichi Zhang, Beijing (CN); Yilin Feng, Beijing (CN); Wenchao Han, Beijing (CN); Wei Sun, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 957 days.

(21) Appl. No.: 17/757,886

(22) PCT Filed: Sep. 10, 2021

(86) PCT No.: PCT/CN2021/117700
§ 371 (c)(1),
(2) Date: Jun. 22, 2022

(87) PCT Pub. No.: WO2022/078133
PCT Pub. Date: Apr. 21, 2022

(65) Prior Publication Data

US 2023/0030379 A1 Feb. 2, 2023

(30) Foreign Application Priority Data

Oct. 13, 2020 (CN) ......................... 202011088577.4

(51) Int. Cl.
*H10F 39/00* (2025.01)
*H10D 30/01* (2025.01)
*H10D 30/67* (2025.01)

(52) U.S. Cl.
CPC ..... *H10F 39/80377* (2025.01); *H10D 30/031* (2025.01); *H10D 30/6723* (2025.01);
(Continued)

(58) Field of Classification Search
CPC .... H10F 39/8057; H10F 39/16; H10F 39/024; H10D 30/031; H10D 30/6723; H10D 30/6757
See application file for complete search history.

(56) References Cited

U.S. PATENT DOCUMENTS

2006/0077167 A1 4/2006 Kim et al.
2007/0188441 A1* 8/2007 Tanaka ................ G09G 3/3406 345/102
2008/0170047 A1* 7/2008 Sato ...................... G06F 3/0412 345/175
2008/0245948 A1 10/2008 Tsai
2009/0086137 A1 4/2009 Horiguchi et al.
(Continued)

FOREIGN PATENT DOCUMENTS

CN 101017273 A 8/2007
CN 101281916 A 10/2008
(Continued)

OTHER PUBLICATIONS

ISA China National Intellectual Property Administration, International Search Report and Written Opinion Issued in Application No. PCT/CN2021/117700, Dec. 2, 2021, WIPO, 16 pages. (Submitted with Partial Translation).

*Primary Examiner* — Britt Hanley
*Assistant Examiner* — Jason James Greaving
(74) *Attorney, Agent, or Firm* — WHDA, LLP

(57) ABSTRACT

The present disclosure provides a display panel, a method of manufacturing the same, and a display device, which belong
(Continued)

to the technical field of display. A peripheral area of the display panel is provided with a photosensitive TFT structure, the photosensitive TFT structure includes a reference TFT unit and a photosensitive TFT unit, first electrodes of a reference TFT included in the reference TFT unit and a photosensitive TFT included in the photosensitive TFT unit are connected to a signal input terminal of the photosensitive TFT structure; a second electrode of the reference TFT is connected to a second signal line of the photosensitive TFT structure; a second electrode of the photosensitive TFT is connected to a third signal line of the photosensitive TFT structure; a gate electrode of the reference TFT is connected to a first control terminal of the photosensitive TFT structure, and a gate electrode of the photosensitive TFT is connected to a second control terminal of the photosensitive TFT structure. The present disclosure can integrate a photosensitive TFT structure on a display panel to detect ambient light.

19 Claims, 9 Drawing Sheets

(52) U.S. Cl.
CPC ....... *H10D 30/6757* (2025.01); *H10F 39/016* (2025.01); *H10F 39/024* (2025.01); *H10F 39/8057* (2025.01)

(56) References Cited

U.S. PATENT DOCUMENTS

2009/0103025 A1 4/2009 Tanno et al.
2009/0248344 A1 10/2009 Hirabayashi et al.
2010/0224878 A1* 9/2010 Kimura .............. H10D 30/6755 257/E29.296
2011/0148834 A1* 6/2011 Baek .................... G09G 3/3406 345/207
2020/0091253 A1* 3/2020 Liu ................... H01L 27/14612
2020/0211480 A1 7/2020 Xiang et al.
2022/0310731 A1* 9/2022 Chen .................. H10D 30/6757
2023/0154401 A1* 5/2023 Li ........................ G09G 3/3275 345/204

FOREIGN PATENT DOCUMENTS

CN 101403828 A 4/2009
CN 101419371 A 4/2009
CN 101552278 A 10/2009
CN 101847066 A 9/2010
CN 102103843 A 6/2011
CN 108717244 A 10/2018
CN 111341808 A 6/2020
CN 111445869 A * 7/2020 ........... G09G 3/3406
CN 214253696 U 9/2021
JP 2000122574 A 4/2000

* cited by examiner

DISPLAY PANEL, METHOD OF MANUFACTURING THE SAME AND DISPLAY DEVICE

CROSS REFERENCE TO RELATED APPLICATIONS

The present application is the U.S. National Phase of International Application No. PCT/CN2021/117700 entitled "DISPLAY PANEL, METHOD OF MANUFACTURING THE SAME AND DISPLAY DEVICE" and filed on Sep. 10, 2021. International Application No. PCT/CN2021/117700 claims priority to Chinese Patent Application No. 202011088577.4 filed on Oct. 13, 2020. The entire contents of each of the above-listed applications are hereby incorporated by reference for all purposes.

TECHNICAL FIELD

The present disclosure relates to the field of display technology, and more particularly to a display panel, a method of manufacturing the same and a display device.

BACKGROUND

In the related art, a light sensor for detecting ambient light is arranged on the display product, and the light sensor is generally located above the screen. After the ambient light is detected by the light sensor, the brightness of the ambient light of the environment where the display product is located can be obtained. The brightness of the display product can be automatically adjusted according to the brightness of the ambient light, so as to bring the best visual effect to the user.

SUMMARY

An embodiment of the present disclosure provides a display panel, a method of manufacturing the same and a display device.

In a first aspect, an embodiment of the present disclosure provides a display panel including a display substrate, wherein the display substrate includes a base substrate, the base substrate includes a display area and a peripheral area, the peripheral area is provided with a photosensitive thin film transistor structure, the photosensitive thin film transistor structure includes a reference thin film transistor unit and a photosensitive thin film transistor unit, and the reference thin film transistor unit includes a plurality of reference thin film transistors, the photosensitive thin film transistor unit includes a plurality of photosensitive thin film transistors; a light shielding layer is arranged on a side of the photosensitive thin film transistor structure close to a display side of the display panel, wherein an orthographic projection of the reference thin film transistor on the base substrate is located within an orthographic projection of the light shielding layer on the base substrate, at least part of an orthographic projection of a channel region of the photosensitive thin film transistor on the base substrate does not overlap the orthographic projection of the light shielding layer on the base substrate; first electrodes of the reference thin film transistor and the photosensitive thin film transistor are both connected to a signal input terminal of the photosensitive thin film transistor structure; a second electrode of the reference thin film transistor is connected to a second signal line of the photosensitive thin film transistor structure, a second electrode of the photosensitive thin film transistor is connected to a third signal line of the photosensitive thin film transistor structure; a gate electrode of the reference thin film transistor is connected to a first control terminal of the photosensitive thin film transistor structure, a gate electrode of the photosensitive thin film transistor is connected to a second control terminal of the photosensitive thin film transistor structure.

In some embodiments, the peripheral area includes a first peripheral area and a second peripheral area located on opposite sides of the display area respectively, the second peripheral area is configured to bind a circuit board, the photosensitive thin film transistor structure is arranged at a position of the first peripheral area close to the display area.

In some embodiments, the display panel further includes: a first light shielding pattern, located on a side of the reference thin film transistor away from the display side of the display panel, wherein an orthographic projection of an active layer of the reference thin film transistor on the base substrate is located within an orthographic projection of the first light shielding pattern on the base substrate; a second light shielding pattern, located on a side of the photosensitive thin film transistor away from the display side of the display panel, and wherein an orthographic projection of an active layer of the photosensitive thin film transistor on the base substrate is located within an orthographic projection of the second light shielding pattern on the base substrate.

In some embodiments, the first light shielding pattern and the gate electrode of the reference thin film transistor are arranged in a same layer and made of a same material; the second light shielding pattern and the gate electrode of the photosensitive thin film transistor are located in a same layer and made of a same material.

In some embodiments, the reference thin film transistor unit includes N reference thin film transistors; the photosensitive thin film transistor unit includes N photosensitive thin film transistors, wherein N is an integer greater than 100.

In some embodiments, a width to length ratio of a channel region of the photosensitive thin film transistor is less than or equal to 5/4.

In some embodiments, the display area is provided with a thin film transistor for display, the gate electrode of the reference thin film transistor, the gate electrode of the photosensitive thin film transistor and a gate electrode of the thin film transistor for display are located in a same layer and made of a same material; and/or the first electrode of the reference thin film transistor, the first electrode of the photosensitive thin film transistor and a first electrode of the thin film transistor for display are located in a same layer and made of a same material; and/or the second electrode of the reference thin film transistor, the second electrode of the photosensitive thin film transistor and a second electrode of the thin film transistor for display are located in a same layer and made of a same material.

In some embodiments, the peripheral area comprises a first peripheral area and a second peripheral area, and the first peripheral area and the second peripheral area are respectively located on opposite sides of the display area, the photosensitive thin film transistor structure is located in the first peripheral area, the first peripheral area is provided with a third connection line, and the second peripheral area is provided with a first terminal, the gate electrode of the reference thin film transistor and the gate electrode of the photosensitive thin film transistor are both connected to the third connection line, the third connection line is connected to the third line in a different layer through a via hole, the third connection line is connected to a fifth connection line in a different layer through a via hole, the fifth connection line extends to the second peripheral area and is connected to the first terminal, and the first terminal is configured to input a control signal to the gate electrode of the reference thin film transistor and the gate electrode of the photosensitive thin film transistor.

In some embodiments, the gate electrode of the reference thin film transistor and the first light shielding pattern are formed in an integral structure, and a whole shape is a long strip extending in a row direction; the gate electrode of the photosensitive thin film transistor and the second light shielding pattern are formed in an integral structure, and a whole shape is a long strip extending along the row direction; the first light shielding pattern is connected to the second light shielding pattern, and the third connection line, the first light shielding pattern and the second light shielding pattern are arranged on a same layer and formed in an integral structure; a line width of the third connection line is smaller than a line width of the first light shielding pattern and the second light shielding pattern.

In some embodiments, the peripheral area comprises a first peripheral area and a second peripheral area, and the first peripheral area and the second peripheral area are respectively located on opposite sides of the display area, the photosensitive thin film transistor structure is located in the first peripheral area, the peripheral area is provided with a second connection line and a fourth connection line, and the second peripheral area is provided with a second terminal and a fourth terminal; wherein the fourth connection line is connected to the second signal line and the second terminal; the second connection line is connected to the third signal line and the fourth terminal.

In some embodiments, the fourth connection line and the second connection line are located on two sides of the display area respectively.

In a second aspect, a display device includes the display panel.

In some embodiments, the display device further includes: a signal input unit, configured to input a direct current signal or a square wave signal to the signal input end; a control unit, configured to input a turn-on signal to the first control terminal and the second control terminal; a current detection unit, configured to detect a first current of the second signal line and a second current of the third signal line; and a processing unit, configured to determine an intensity of ambient light according to values of the first current and the second current.

In some embodiments, the turn-on signal is the square wave signal.

In some embodiments, one period of the square wave signal is divided into two time phases, one of the two time phases is a high level, the other of the two time phases is a low level, and a proportion of each time phase in one period is 50%, and a frequency of the turn-on signal is consistent with a refresh frequency of a display screen.

In some embodiments, the signal input unit inputs the square wave signal to the signal input terminal, and a frequency of the square wave signal is consistent with a frequency of the turn-on signal.

In a third aspect, a method of manufacturing a display panel, wherein the display panel includes a display substrate, the display substrate includes a base substrate, the base substrate has a display area and a peripheral area, and the method includes: forming a photosensitive thin film transistor structure in the peripheral area, wherein the photosensitive thin film transistor structure includes a reference thin film transistor unit and a photosensitive thin film transistor unit, the reference thin film transistor unit includes a plurality of reference thin film transistors, and the photosensitive thin film transistor unit includes a plurality of photosensitive thin film transistors; forming a light shielding layer on a side of the photosensitive thin film transistor structure close to a display side of the display panel, wherein an orthographic projection of the reference thin film transistor on the base substrate is located within an orthographic projection of the light shielding layer on the base substrate, at least part of an orthographic projection of a channel region of the photosensitive thin film transistor on the base substrate does not overlap the orthographic projection of the light shielding layer on the base substrate; connecting a first electrode of the reference thin film transistor and a first electrode of the photosensitive thin film transistor to a signal input terminal of the photosensitive thin film transistor structure; connecting a second electrode of the reference thin film transistor to a second signal line of the photosensitive thin film transistor structure, connecting a second electrode of the photosensitive thin film transistor to a third signal line of the photosensitive thin film transistor structure; connecting a gate electrode of the reference thin film transistor to a first control terminal of the photosensitive thin film transistor structure, connecting a gate electrode of the photosensitive thin film transistor to a second control terminal of the photosensitive thin film transistor structure.

In some embodiments, the method further includes: forming a first light shielding pattern on a side of the reference thin film transistor away from the display side of the display panel, wherein an orthographic projection of an active layer of the reference thin film transistor on the base substrate is located within an orthographic projection of the first light shielding pattern on the base substrate; forming a second light shielding pattern on a side of the photosensitive thin film transistor away from the display side of the display panel, and wherein an orthographic projection of an active layer of the photosensitive thin film transistor on the base substrate is located within an orthographic projection of the second light shielding pattern on the base substrate.

In some embodiments, forming the first light shielding pattern and the gate electrode of the reference thin film transistor through one patterning process; forming the second light shielding pattern and the gate electrode of the photosensitive thin film transistor by one patterning process.

In some embodiments, the display area is provided with a thin film transistor for display, and the method includes: forming the gate electrode of the reference thin film transistor, the gate electrode of the photosensitive thin film transistor and a gate electrode of the thin film transistor for display by one patterning process; forming the first electrode of the reference thin film transistor, the first electrode of the photosensitive thin film transistor and a first electrode of the thin film transistor for display by one patterning process; forming the second electrode of the reference thin film transistor, the second electrode of the photosensitive thin film transistor and a second electrode of the thin film transistor for display by one patterning process.

REFERENCE NUMBER

Figure 1:
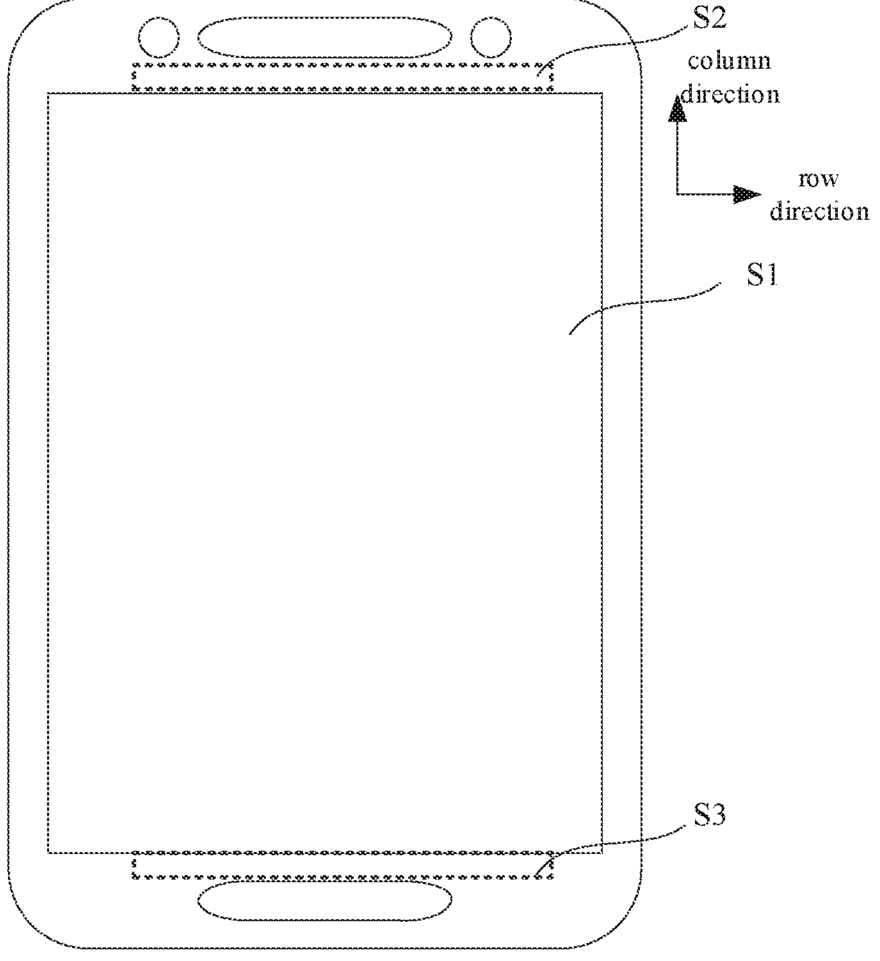
FIG. 1 is a schematic diagram of a region of a display panel.

12 gate electrode of the reference thin film transistor
14 gate electrode of the photosensitive thin film transistor
15, 16 light shielding patterns
21 active layer of the reference thin film transistor
22 active layer of the photosensitive thin film transistor
31 first signal line
32 source electrode of the reference thin film transistor
33 drain electrode of the reference thin film transistor
34 source electrode of photosensitive thin film transistor
35 drain electrode of photosensitive thin film transistor
I1 second signal line
I2 third signal line
G1 first control terminal
G2 second control terminal
S signal input terminal
4 base substrate
5 black matrix
6 base substrate
7 gate insulating layer
8 interlayer insulating layer
9 passivation layer
10 light shielding layer
SD1 first line
SD2 second line
SD3 third line
SD4 fourth line
G11 first connection line
G12 second connection line
G13 third connection line
G14 fourth connection line
G15 fifth connection line
D1 first terminal
D2 second terminal
D3 third terminal
D4 fourth terminal

DETAILED DESCRIPTION

In order to make the technical problems, technical solutions and advantages to be solved by the embodiments of the present disclosure more clear, the following detailed description will be given in conjunction with the accompanying drawings and specific embodiments.

Embodiments of the present disclosure provide a display panel, a method of manufacturing the same, and a display device, which can integrate a photosensitive thin film transistor structure on the display panel to detect the ambient light.

Embodiments of the present disclosure provide a display panel including a display substrate, the display substrate includes a base substrate, the base substrate includes a display area and a peripheral area, the display area includes a plurality of pixel units arranged in an array, the plurality of pixel units are arranged in the row direction and the column direction, the peripheral area is provided with a photosensitive thin film transistor structure, the photosensitive thin film transistor structure includes a reference thin film transistor unit and a photosensitive thin film transistor unit, and the reference thin film transistor unit includes a plurality of reference thin film transistors, the photosensitive thin film transistor unit includes a plurality of photosensitive thin film transistors;

A light shielding layer is arranged on a side of the photosensitive thin film transistor structure close to a display side of the display panel, wherein an orthographic projection of the reference thin film transistor on the base substrate is located within an orthographic projection of the light shielding layer on the base substrate, at least part of an orthographic projection of a channel region of the photosensitive thin film transistor on the base substrate does not overlap the orthographic projection of the light shielding layer on the base substrate;

First electrodes of the reference thin film transistor and the photosensitive thin film transistor are both connected to a signal input terminal of the photosensitive thin film transistor structure; a second electrode of the reference thin film transistor is connected to a second signal line of the photosensitive thin film transistor structure, a second electrode of the photosensitive thin film transistor is connected to a third signal line of the photosensitive thin film transistor structure; a gate electrode of the reference thin film transistor is connected to a first control terminal of the photosensitive thin film transistor structure, a gate electrode of the photosensitive thin film transistor is connected to a second control terminal of the photosensitive thin film transistor structure.

In this embodiment, the peripheral area of the display panel is provided with a photosensitive thin film transistor structure, the photosensitive thin film transistor structure includes a reference thin film transistor unit and a photosensitive thin film transistor unit, the reference thin film transistor unit includes a plurality of reference thin film transistors, and the photosensitive thin film transistor unit includes a plurality of photosensitive thin film transistors, a light shielding layer for shielding the reference thin film transistor is provided on the side of the reference thin film transistor away from the base substrate of the display panel, so that the reference thin film transistor will not be affected by ambient light; at least part of the channel region of the photosensitive thin film transistor is not shielded by the light shielding layer, the photosensitive thin film transistor can receive external light; wherein, the first electrodes of the reference thin film transistor and the photosensitive thin film transistor are both connected to the signal input terminal of the photosensitive thin film transistor structure; the second electrode of the reference thin film transistor is connected to the second signal line of the photosensitive thin film transistor structure; the second electrode of the photosensitive thin film transistor is connected to the third signal line of the photosensitive thin film transistor structure; the gate electrode of the reference thin film transistor is connected to the first control terminal of the photosensitive thin film transistor structure, the gate electrode of the photosensitive thin film transistor is connected to the second control terminal of the photosensitive thin film transistor structure. During ambient light detection, an electrical signal is inputted to the signal input terminal, the current of the second signal line and the third signal line is compared by detecting the current of the second signal line and the current of the third signal line, and the brightness of the ambient light can be calculated and obtained. In this embodiment, a photosensitive thin film transistor structure is integrated on the display panel to replace an additional photosensitive sensor on the display device, which can reduce the cost of the display device, save the space occupied by the photosensitive sensor, and increase the product competition of the display device.

When the photosensitive thin film transistor is used to detect ambient light, the channel region of the photosensitive thin film transistor is used to detect light, wherein the active layer includes a source region, a drain region, and a channel region between the source region and the drain region. The source region is a region where the active layer contacts the source electrode, the drain region is a region where the active layer contacts the drain electrode, the channel region corresponds to a gap between the source electrode and the drain electrode, and is the region between the source region and the drain region. Therefore, at least the light shielding layer near the display side of the channel region needs to be removed to expose the channel region of the photosensitive thin film transistor.

In this embodiment, the photosensitive thin film transistor structure includes a reference thin film transistor unit and a photosensitive thin film transistor unit, and the reference thin film transistor of the reference thin film transistor unit is shielded by the light shielding layer, so that the DC signal is inputted to the reference thin film transistor unit, and the current detected by the second signal line can be used as the reference current; the channel region of the photosensitive thin film transistor of the photosensitive thin film transistor unit is not shielded by the light shielding layer. When the ambient light illuminates the photosensitive thin film transistor unit, the characteristics of the photosensitive thin film transistor unit will be affected by the ambient light. The current outputted by the third signal line will change. By comparing the current detected by the third signal line with the reference current, the influence of ambient light on the photosensitive thin film transistor can be determined, so that the brightness of the ambient light can be obtained. In order to ensure the detection accuracy, the parameters of the photosensitive thin film transistor and the reference thin film transistor should be consistent. Components (including the gate electrode, the first electrode, the second electrode and the active layer) of the photosensitive thin film transistor and the reference thin film transistor are made of the same material and have the same dimension.

In order not to affect the display of the display panel, the photosensitive thin film transistor structure is arranged in the peripheral area of the display panel. As shown in FIG. 1, the peripheral area includes a first peripheral area S2 and a second peripheral area S3 located on opposite sides of the display area S1 respectively. The second peripheral area S3 is used to bind the circuit board. The photosensitive thin film transistor structure is arranged at a position of the first peripheral area S2 close to the display area.

Because when the display panel is applied to a display product such as a handheld mobile terminal, the user will not block the first peripheral area S2 above the display area S1 when the user uses the display product, the photosensitive thin film transistor structure is arranged in the first peripheral area S2, the photosensitive thin film transistor structure can receive the ambient light, so as to detect the ambient light. In addition, the second peripheral area S3 is used to bind the circuit board, and the signal lines for transmitting display signals extend from the second peripheral area S3 to the display area S1, but not to the first peripheral area S2, so that the photosensitive thin film transistor structure is arranged in the first peripheral area S2, and there is no risk of coupling with the signal line. The arrangement of the photosensitive thin film transistor structure will not affect the signal on the signal line, and thus will not affect the display; in addition, the signal transmitted on the signal line will not affect the detection result of the photosensitive thin film transistor structure, which can ensure the accuracy of the detection result of the photosensitive thin film transistor structure. In some embodiments, the signal lines may be, for example, data signal lines.

If the photosensitive thin film transistor structure is arranged in the second peripheral area S3, on the one hand, when the display product is used, the user's body will block part of the ambient light, causing the ambient light received by the photosensitive thin film transistor structure to be inconsistent with the actual ambient light; on the other hand, there is a signal line in the second peripheral area S3, and the photosensitive thin film transistor structure is arranged in the first peripheral area S2, there is a risk of coupling with the signal line, which further affects the accuracy of the detection result.

When making reference thin film transistors and photosensitive thin film transistors, individual differences are unavoidable due to process limitations. In order to reduce the influence of individual differences on the detection results, a plurality of reference thin film transistors can be made to form a reference thin film transistor unit, and a plurality of photosensitive thin film transistors can be made to form the photosensitive thin film transistor unit, and the number of photosensitive thin film transistors included in the photosensitive thin film transistor unit is consistent with the number of reference thin film transistors included in the reference thin film transistor unit. Specifically, the reference thin film transistor unit may include more than 100 reference thin film transistors, such as 300 reference thin film transistors; the photosensitive thin film transistor unit may include more than 100 photosensitive thin film transistors, such as 300 photosensitive thin film transistors, which can reduce influence of individual differences of thin film transistors on detection results.

Since the reference thin film transistor unit includes hundreds of reference thin film transistors, and the photosensitive thin film transistor unit includes hundreds of photosensitive thin film transistors, the entire photosensitive thin film transistor structure needs to occupy a certain area on the display panel. In some embodiments, the width of the photosensitive thin film transistor structure in the column direction can be 5 um and the length thereof in the row direction can be 15 mm.

In addition, the minimum distance between the photosensitive thin film transistor structure and an edge of the display area can be 3-5 um, and the process limit needs to be considered to reserve space for the thin film transistor circuit.

The reference thin film transistor unit may include a plurality of reference thin film transistors arranged in multiple rows and multiple columns, and the photosensitive thin film transistor unit may include a plurality of photosensitive thin film transistors arranged in multiple rows and multiple columns. In order to facilitate the production of the reference thin film transistor and the photosensitive thin film transistor, the orthographic projection of the reference thin film transistor on the base substrate does not overlap the orthographic projection of the photosensitive thin film transistor on the base substrate, and the reference thin film transistor and the photosensitive thin film transistor can be located in the same layer, that is, the active layer of the reference thin film transistor and the active layer of the photosensitive thin film transistor are located in the same layer, the source and drain electrodes of the reference thin film transistor are located in the same layer as the source and drain electrodes of the photosensitive thin film transistor, the gate electrode of the reference thin film transistor and the gate electrode of the photosensitive thin film transistor are located in the same layer, and the gate insulating layer of the reference thin film transistor is located in the same layer as the gate insulating layer of the photosensitive thin film transistor, so that the active layer of the reference thin film transistor and the active layer of the photosensitive thin film transistor can be made by one patterning process, and the source and drain electrode of the reference thin film transistor and the source and drain electrode of the photosensitive thin film can be made by one patterning process, the gate electrode of the reference thin film transistor and the gate electrode of the photosensitive thin film transistor are made by one patterning process, and the gate insulating layer of the reference thin film transistor and the gate insulating layer of the photosensitive thin film transistor are made by one patterning process. The number of patterning processes is reduced. On the other hand, the reference thin film transistor and the photosensitive thin film transistor have high consistency in light receiving conditions other than for receiving ambient light differently, which can improve the detection accuracy.

The reference thin film transistor and the photosensitive thin film transistor can be aligned in the row direction or the column direction. For example, the reference thin film transistor unit includes ten rows and ten columns of reference thin film transistors, and the photosensitive thin film transistor unit includes ten rows and ten columns of photosensitive thin film transistors. The kth row of reference thin film transistors of the reference thin film transistor unit are located on the same straight line as the kth row of photosensitive thin film transistors of the photosensitive thin film transistor unit, or the jth column of reference thin film transistors of the reference thin film transistor unit are located on the same straight line as the jth column of the photosensitive thin film transistors of the photosensitive thin film transistor unit, and k, j are integers greater than 0 and less than or equal to 10. The number of rows and columns of the reference thin film transistors included in the reference thin film transistor unit may be the same as the number of rows and columns of the photosensitive thin film transistors included in the photosensitive thin film transistor unit, or may be the different from the number of rows and columns of the photosensitive thin film transistors included in the photosensitive thin film transistor unit. It should be noted that, the row direction may be consistent with the row direction of the plurality of pixel units, and the column direction may be consistent with the column direction of the plurality of pixel units.

The reference thin film transistor unit and the photosensitive thin film transistor unit may be symmetrical with respect to the axis of the display panel (such as the central axis of the display panel in the column direction), or may not be symmetrical with respect to the axis of the display panel, as long as the photosensitive thin film transistor unit can receive external light.

For a display panel provided with a backlight, in order to prevent the thin film transistor from being affected by the backlight, the display panel further includes:

A first light shielding pattern, located on a display side of the reference thin film transistor away from the display panel, wherein an orthographic projection of the active layer of the reference thin film transistor on the base substrate is located within the orthographic projection of the first light shielding pattern on the base substrate;

A second light shielding pattern, located on a display side of the photosensitive thin film transistor away from the display panel, and wherein an orthographic projection of the active layer of the photosensitive thin film transistor on the base substrate is located within an orthographic projection of the second light shielding pattern on the base substrate.

When the photosensitive thin film transistor and the reference thin film transistor are located on the side of the display panel close to the display side, the first light shielding pattern is located on the side of the reference thin film transistor facing the base substrate, and the second light shielding pattern is located on a side of the photosensitive thin film transistor facing the base substrate. When the photosensitive thin film transistor and the reference thin film transistor are located on the side of the display panel away from the display side, the first light shielding pattern is located on the side of the reference thin film transistor away from the base substrate, and the second light shielding pattern is located at the photosensitive thin film transistor away from the base substrate.

In this way, the light of the backlight source can be prevented from illuminating the reference thin film transistor through the first light shielding pattern, and the light of the backlight source can be prevented from illuminating the photosensitive thin film transistor through the second light shielding pattern. An additional film layer can be added to make the first light shielding pattern and the second light shielding pattern, or the film layer of the photosensitive thin film transistor structure can be used to make the first light shielding pattern and the second light shielding pattern, which can simplify the photosensitive thin film transistor structure and production process.

The first light shielding pattern and the second light shielding pattern may be independent of each other, or may form an integral structure. The first light shielding pattern and the second light shielding pattern are an integral pattern to shield the light of the backlight source.

In some embodiments, when the gate electrode of the reference thin film transistor is located between the active layer and the base substrate, the first light shielding pattern may be located in the same layer and made of the same material as the gate electrode of the reference thin film transistor, and the gate electrode of the reference thin film transistor is generally made of opaque metal, which can shield light; when the gate electrode of the photosensitive thin film transistor is located between the active layer and the base substrate, the second light shielding pattern and the gate electrode of the photosensitive thin film transistor are located in the same layer and made of the same material, and the gate electrode of the photosensitive thin film transistor is generally made of opaque metal, which can shield light. In this way, there is no need to add a special film layer to make the first light shielding pattern and the second light shielding pattern. When the first light shielding pattern and the gate electrode of the reference thin film transistor are located in the same layer and are made of the same material, the first light shielding pattern is made of a conductive and opaque material, and the first light shielding pattern and the gate electrode of the reference thin film transistor are an integral structure, the integral structure not only serves as the gate electrode of the reference thin film transistor to control the turn-off and turn-on of the reference thin film transistor, but also serves as the first light shielding pattern to shield the light on the side of the reference thin film transistor away from the display side of the display panel, for example the light of the backlight source is prevent from illuminating the reference thin film transistor; when the second light shielding pattern and the gate electrode of the photosensitive thin film transistor are located in the same layer and made of the same material, the second light shielding pattern is made of a conductive and opaque material, the second light shielding pattern and the gate electrode of the photosensitive thin film transistor are an integral structure. The integral structure not only serves as the gate electrode of the photosensitive thin film transistor to control the turn-off and turn-on of the photosensitive thin film transistor, but also serves as the second light shielding pattern to shield the light on the side of the photosensitive thin film transistor away from the display side of the display panel, for example, the light from the backlight source can be prevented from being illuminating the photosensitive thin film transistor.

The size of the first light shielding pattern and the second light shielding pattern can be designed as required, as long as it is ensured that the orthographic projection of the active layer of the reference thin film transistor on the base substrate is located within the orthographic projection of the first light shielding pattern on the base substrate and the orthographic projection of the active layer of the photosensitive thin film transistor on the base substrate is located within the orthographic projection of the second light shielding pattern on the base substrate. Further, the area of the orthographic projection area of the first light shielding pattern on the base substrate is larger than the area of the orthographic projection area of the active layer of the reference thin film transistor on the base substrate, and the area of the orthographic projection of the second light shielding pattern on the base substrate is larger than the area of the orthographic projection area of the active layer of the photosensitive thin film transistor on the base substrate, so as to avoid the light from a side of the photosensitive thin film transistor structure away from the display side of the display panel from obliquely illuminating to the active layer of the photosensitive thin film transistor and the active layer of the reference thin film transistor, which can effectively shield the photosensitive thin film transistor structure.

In the display products of the related art, the photosensitive thin film transistor structure is not arranged in the peripheral area of the display panel, and a light shielding layer is formed in the peripheral area or on the color filter substrate or package cover of the display panel to shield the circuits in the peripheral area. In the technical solution, since the photosensitive thin film transistor unit needs to receive external light, it is necessary to remove at least part of the light shielding layer of the photosensitive thin film transistor close to the display side, so that the channel region of the photosensitive thin film transistor of the photosensitive thin film transistor unit can be exposed. The film layers of the photosensitive thin film transistor unit, such as the gate electrode, the source electrode and the drain electrode, are made of metal. If too many light shielding layers are removed, there will be a problem of bright lines caused by light reflection.

In some embodiments, the light shielding layer is located on the display substrate, and is located on the side of the photosensitive thin film transistor facing the display side of the display panel, the light shielding layer needs to be partially removed, so that ambient light can be irradiated to the photosensitive thin film transistor unit; in some embodiments, the light shielding layer is located on an opposite substrate of the display substrate, and the opposite substrate is located on the display side of the display substrate, the light shielding layer needs to be partially removed so that ambient light can be irradiated to the photosensitive thin film transistor unit; in some embodiments, the light shielding layer includes a first light shielding layer arranged on the display substrate, and also includes a second light shielding layer arranged on the opposite substrate, and both the first light shielding layer and the second light shielding layer are located at a side of the photosensitive thin film transistor facing the display side of the display panel. At this time, both the first light shielding layer and the second light shielding layer need to be partially removed, so that ambient light can be irradiated to the photosensitive thin film transistor unit.

Figure 2A:
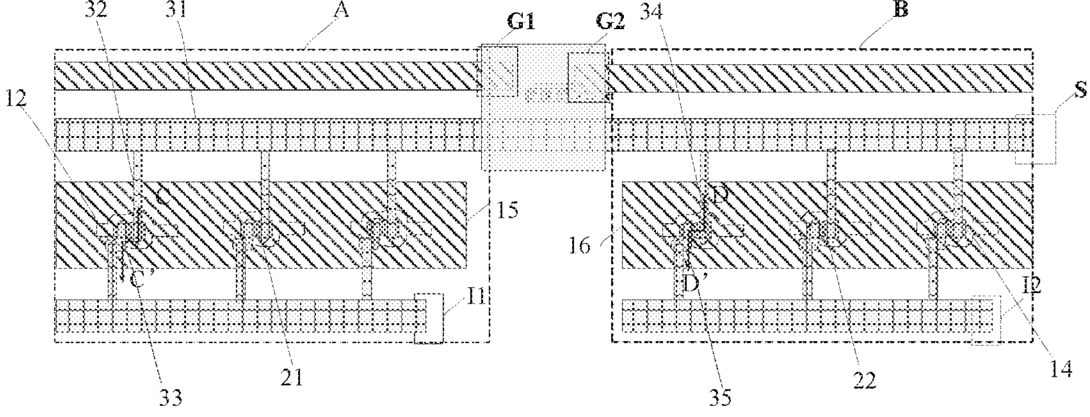
FIGS. 2*a* and 2*b* are schematic diagrams of the structure of a photosensitive thin film transistor according to an embodiment of the disclosure.
Figure 2B:
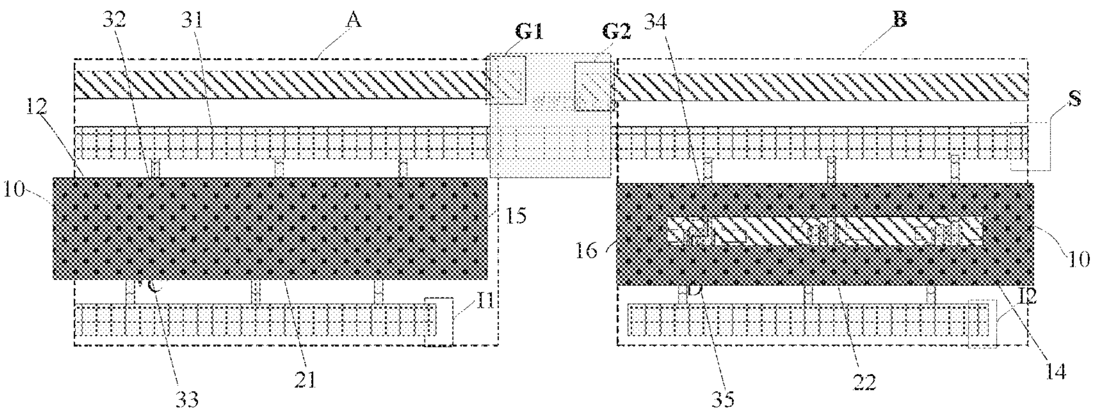

In this embodiment, the width to length ratio of the channel region of the photosensitive thin film transistor can be designed to be less than or equal to 5/4. As shown in FIG. 2*a* and FIG. 2*b*, the size of the channel region of the active layer 22 of the photosensitive thin film transistor in the row direction is the length of the channel region, and the size of the channel region of the active layer 22 of the photosensitive thin film transistor in the column direction is the width of the channel region, wherein the channel region of the active layer 22 of the photosensitive thin film transistor is a part of active Layer 22 corresponding to the gap between source electrode 34 and drain electrode 35. The plurality of photosensitive thin film transistors included in the photosensitive thin film transistor unit can be located in the same row, so that the width of the channel region of the photosensitive thin film transistor unit in the column direction is only 5 um or less, which is much smaller than the width of the pixel of 30 um, so that a part of the peripheral area where the light shielding layer is not provided, that is, the opening of the light shielding layer is only a slit, and the problem of bright lines caused by light reflection will not occur. It should be noted that, the row direction may be consistent with the row direction of the plurality of pixel units, and the column direction may be consistent with the column direction of the plurality of pixel units.

The display area of the display panel is provided with thin film transistors for display, including driving thin film transistors and switching thin film transistors, etc. The gate electrode of the reference thin film transistor, the gate electrode of the photosensitive thin film transistor and the gate electrode of the thin film transistor for display are located in the same layer and made of the same material; and/or, the first electrode of the reference thin film transistor, the first electrode of the photosensitive thin film transistor and the first electrode of the thin film transistor for display are located in the same layer and made of the same material and/or, the second electrode of the reference thin film transistor, the second electrode of the photosensitive thin film transistor and the second electrode of the thin film transistor for display are located in the same layer and made of the same material.

The first electrode may be one of the source electrode and the drain electrode, and the second electrode may be the other of the source electrode and the drain electrode.

If the gate electrode of the reference thin film transistor and the gate electrode of the photosensitive thin film transistor and the gate electrode of the thin film transistor for display are located in the same layer and made of the same material, the first electrode of the reference thin film transistor, the first electrode of the photosensitive thin film transistor and the first electrode of the thin film transistor for display are located in the same layer and made of the same material, the second electrode of the reference thin film transistor, the second electrode of the photosensitive thin film transistor and the second electrode of the thin film transistor for display is located in the same layer and made of the same material, so that the gate electrode of the reference thin film transistor and the gate electrode of the photosensitive thin film transistor can be made at the same time as the gate electrode of the thin film transistor for display. The first electrode of the reference thin film transistor and the first electrode of the photosensitive thin film transistor can be made at the same time as the first electrode of the thin film transistor for display, and the second electrode of the reference thin film transistor and the second electrode of the photosensitive thin film transistor can be made at the same time as the second electrode of the thin film transistor for display, so that the manufacturing process of the display panel can be simplified, the production cost of the display panel can be reduced, and the production efficiency of the display panel can be improved.

In some embodiments, in the photosensitive thin film transistor unit, the arrangement density of the plurality of photosensitive thin film transistors along the row direction is greater than the arrangement density of the plurality of the thin film transistors for display along the row direction; and/or, the arrangement density of the plurality of photosensitive thin film transistors along the column direction is greater than the arrangement density of the plurality of thin film transistors for display along the column direction. Wherein, the arrangement density of the plurality of photosensitive thin film transistors along the row direction refers to the number of photosensitive thin film transistors arranged in a unit length along the row direction on the display substrate; the arrangement density of the plurality of photosensitive thin film transistors along the column direction refers to the number of photosensitive thin film transistors arranged in a unit length along the column direction on the display substrate; the arrangement density of the plurality of thin film transistors for display along the row/column direction is the same as the above definition, and will not be repeated here. Through the above arrangement, the effective photosensitive area of the photosensitive thin film transistor unit is increased within the unit area of the display substrate, and the intensity of the detection signal is ensured while avoiding increasing the size of the peripheral area.

Further, the arrangement density of the plurality of reference thin film transistors along the row direction is equal to the arrangement density of the plurality of photosensitive thin film transistors along the row direction; and/or the arrangement density of the plurality of reference thin film transistors along the column direction is equal to the arrangement density of the plurality of photosensitive thin film transistors along the column direction. Therefore, the consistency of the reference thin film transistor and the photosensitive thin film transistor in the manufacturing process can be improved, and the difference in the actual patterning result caused by the density difference between the reference thin film transistor and the photosensitive thin film transistor can be avoided, so as to improve the detection accuracy.

Figure 3:
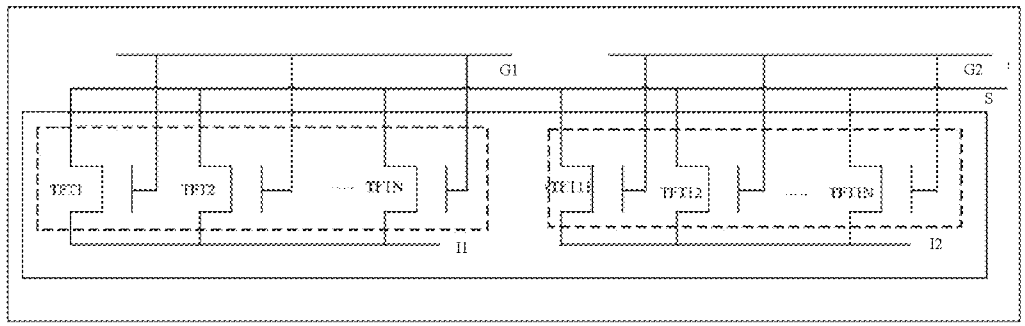
FIG. 3 is a schematic circuit diagram of the photosensitive thin film transistor structure according to an embodiment of the disclosure.

In a specific embodiment, as shown in FIGS. 2*a* and 2*b*, the photosensitive thin film transistor structure is divided into a region A and a region B, the reference thin film transistor unit is set in the region A, and the photosensitive thin film transistor unit is set in the region B, FIGS. 2*a* and 2*b* are only a schematic diagram, and only six thin film transistors are shown. Those skilled in the art should know that both the reference thin film transistor unit and the photosensitive thin film transistor unit include more thin film transistors. FIG. 3 is a schematic circuit diagram corresponding to FIG. 2*a* and FIG. 2*b*.

As shown in FIG. 2*a* and FIG. 2*b*, the reference thin film transistor includes a first gate electrode 12, a first active layer 21, a first source electrode 32 and a first drain electrode 33; the photosensitive thin film transistor includes a second gate electrode 14, a second active layer 22, a second source electrode 34 and a second drain electrode 35; wherein, the plurality of first gate electrodes 12 are all connected to the first control terminal G1, and a turn-on signal is inputted to the first gate electrode 12 through the first control terminal G1, the reference thin film transistor is controlled to be turned on; the plurality of second gate electrodes 14 are connected to the second control terminal G2, and a turn-on signal is inputted to the second gate electrode 14 through the second control terminal G2 to control the photosensitive thin film transistor to be turned on. FIG. 2*a* and FIG. 2*b* only show one setting mode of the control terminal, and it is not limited that the control terminal must be shown in FIG. 2*a* and FIG. 2*b*.

Since the reference thin film transistor and the photosensitive thin film transistor work at the same time, the first gate electrode 12 can be connected to the second gate electrode 14 or can be integrated with the second gate electrode 14; a plurality of first source electrodes 32 and a plurality of second source electrodes 34 are both connected to the first signal line 31, and a DC signal is inputted to the first signal line 31 through the signal input terminal S; the plurality of first drain electrodes 33 are all connected to the second signal line I1, and the plurality of second drain electrodes 35 are all connected to the third signal line I2.

As shown in FIG. 2*a* and FIG. 2*b*, a light shielding layer 10 is provided on the side of the reference thin film transistor close to the display side, and an opening is provided on the light shielding layer 10 on the side of the photosensitive thin film transistor close to the display side, which will not shield the channel region of the active light of the photosensitive thin film transistor. Further, the opening can be enlarged so as not to shield the active layer of the photosensitive thin film transistor; or the light shielding layer 10 is not provided at a side of the photosensitive thin film transistor close to the display side.

The orthographic projection of the first active layer 21 on the base substrate is within the orthographic projection of the first gate electrode 12 on the base substrate, and the orthographic projection of the second active layer 22 on the base substrate is within the orthographic projection of the second gate electrode 14 on the base substrate; the orthographic projection of the first active layer 21 on the base substrate partially overlaps the orthographic projection of the first source electrode 32 on the base substrate, and the orthographic projection of first active layer 21 on the base substrate partially overlaps the orthographic projection of the first drain electrode 33 on the base substrate; the orthographic projection of the second active layer 22 on the base substrate overlaps the orthographic projection of the second source electrode 34 on the base substrate. The orthographic projection of the second active layer 22 on the base substrate partially overlaps the orthographic projection of the second drain electrode 35 on the base substrate.

In order to shield the light on the non-display side and ensure the detection accuracy, the display panel also includes light shielding patterns 15 and 16. The light shielding pattern 15 can be integrated with the first gate electrode 12, and the whole shape is a long strip extending along the row direction; the light shielding pattern 16 can be an integrated with the second gate electrode 14, and the whole shape is a long strip extending along the row direction.

Figure 2C:
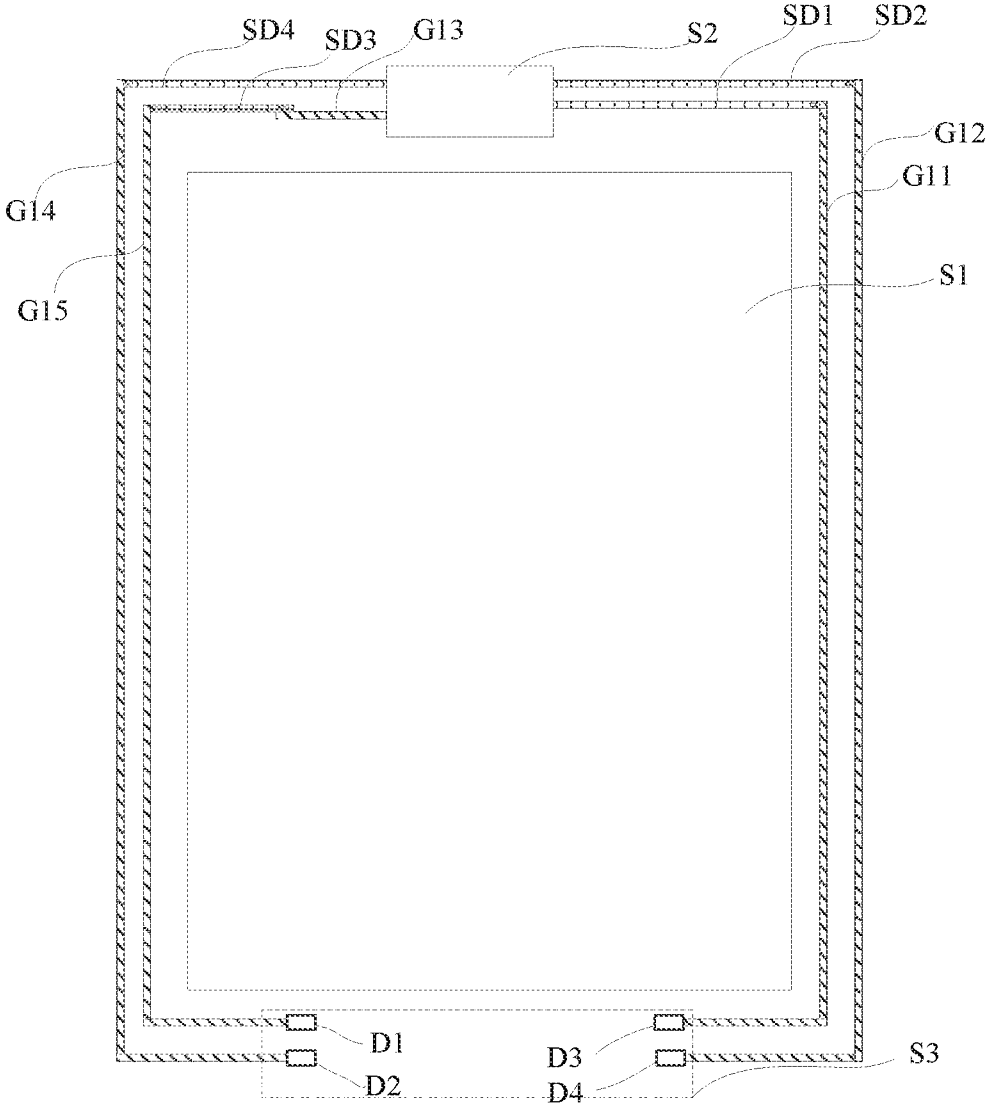
FIG. 2*c* is a schematic diagram of wiring of the display panel according to an embodiment of the disclosure.

FIG. 2*c* is a schematic diagram of the wiring of the display panel according to the embodiment of the disclosure. As shown in FIG. 2*c*, the lines of the photosensitive thin film transistor unit and the reference thin film transistor unit in the first peripheral area S2 extend to the terminals in the second peripheral area S1 through the lines around the display area S1.

Since the reference thin film transistor and the photosensitive thin film transistor work at the same time, the first gate electrode 12 and the second gate electrode 14 can both be connected to the third connection line G13, and the third connection line G13 can be made of a gate metal layer, in order to avoid other lines and/or to avoid signal interference, the third connection line G13 cannot directly extend to the second peripheral area S3, the third connection line G13 can be connected to the third line SD3 through a via hole, and is connected to the fifth connection line G15 through the third line SD3, and the fifth connection line G15 is connected to the first terminal D1 in the second peripheral area S3, and an turn-on signal can be inputted to the first gate electrode 12 and the second gate electrode 14 through the first terminal D1. The first terminal D1 is used as the first control terminal G1 and the second control terminal G2 at the same time, and the control signal from the driving circuit (IC) is transmitted to the plurality of first gate electrodes 12 and the plurality of second gate electrodes 14 through the first terminal D1, to control the reference thin film transistor and the photosensitive thin film transistor to work simultaneously. Wherein, the third line SD3 can be made of a source-drain metal layer, the fifth connection line G15 can be made of a gate metal layer, and the third line SD3 and the fifth connection line G15 are connected through a via hole.

The light shielding pattern 15 and the first gate electrode 12 are an integral structure, and the whole shape is a long strip extending along the row direction; the light shielding pattern 16 and the second gate electrode 14 are an integral structure, and the whole shape is a long strip extending along the row direction. The line width of the third connection line G13 is smaller than that of the light shielding pattern 15 and the light shielding pattern 16, and the line width of the light shielding pattern 15 and the line width of the light shielding pattern 16 may be the same. The light shielding pattern 15 and the light shielding pattern 16 can be connected to form an integral structure, so that the control signal can be inputted from the first terminal D1, pass through G15, SD3 and G13, to simultaneously control a plurality of photosensitive thin film transistors and a plurality of reference thin film transistors to turn on or off. The widths of the light shielding patterns 15 and 16 are the sizes of the light shielding patterns 15 and 16 in a direction perpendicular to the extending direction of the first gate electrode 12 and the second gate electrode 14.

The second signal line I1 may be connected to the fourth line SD4, and connected to the fourth connection line G14 through the fourth line SD4. The fourth line SD4 may be made of a source-drain metal layer, and further, the fourth line SD4 and the second signal line I1 are an integral structure, the fourth connection line G14 can be made of a gate metal layer, the fourth line SD4 is connected to the fourth connection line G14 through a via hole, and the fourth connection line G14 extends to the second peripheral area S3, is connected to the second terminal D2 in the second peripheral area S3, and the electrical signal outputted by the reference thin film transistor unit can be detected through the second terminal D2. Wherein, in the peripheral area at one side of the display area S1 along the row direction, the fourth connection line G14 and the fifth connection line G15 are arranged in parallel in the same layer, and the distance between the fourth connection line G14 and the fifth connection line G15 along the row direction is less than a predetermined threshold to reduce occupied wiring space.

The first signal line 31 can be connected to the first line SD1, and is connected to the first connection line G11 through the first line SD1. The first line SD1 can be made of a source-drain metal layer, and further, the first line SD1 and the first signal line 31 are an integral structure. The first connection line G11 can be made of a gate metal layer. The first line SD1 is connected to the first connection line G11 through a via hole, and the first connection line G11 extends to the second peripheral area S3, is connected to the third terminal D3 in the second peripheral area S3, a direct current signal can be inputted to the first signal line 31 through the third terminal D3, and the third terminal D3 is used as the signal input terminal of the photosensitive thin film transistor structure.

The third signal line I2 can be connected to the second line SD2, and is connected to the second connection line G12 through the second line SD2. The second line SD2 can be made of a source-drain metal layer, and further, the second line SD2 and the third signal line 12 are an integral structure, the second connection line G12 can be made of a gate metal layer, the second line SD2 is connected to the second connection line G12 through a via hole, and the second connection line G12 extends to the second peripheral area S3, is connected to the fourth terminal D4 in the second peripheral area S3, and the electrical signal outputted by the photosensitive thin film transistor unit can be detected through the fourth terminal D4. Wherein, in the peripheral area at one side of the display area S1 along the row direction, the second connection line G12 and the first connection line G11 are arranged in parallel on the same layer, and the distance between the second connection line G12 and the first connection line G11 along the row direction is less than a predetermined threshold to reduce occupied wiring space.

As shown in FIG. 2*c*, the second connection line G12 and the fourth connection line G14 are located on both sides of the display area, respectively, and there is long distance therebetween, so as to avoid the interference between the electrical signal outputted by the photosensitive thin film transistor unit and the electrical signal outputted by the reference thin film transistor unit and affecting the detection results. In the second peripheral area S3, the first terminal D1, the second terminal D2, the third terminal D3 and the fourth terminal D4 can be directly bound with a Touch and Display Driver Integration (TDDI) chip. A photosensitive integrated circuit is integrated on the TDDI chip, and there are pins that are respectively overlapped with the first terminal D1, the second terminal D2, the third terminal D3 and the fourth terminal D4; or, the first terminal D1, the second terminal D2, the third terminal D3 and the fourth terminal D4 can be overlapped with a Flexible Printed Circuit (FPC) first, and then connected with a logic board (TCON), and a photosensitive integrated circuit can be set on the TCON at this time.

Figure 4:
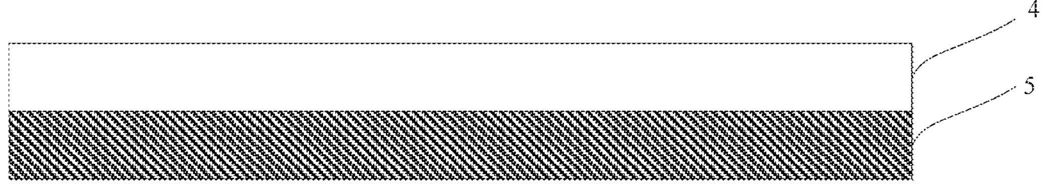
FIGS. 4 and 6 are schematic cross-sectional views of the display panel in the direction of CC' in FIGS. 2*a* and 2*b* according to an embodiment of the present disclosure.
Figure 4:
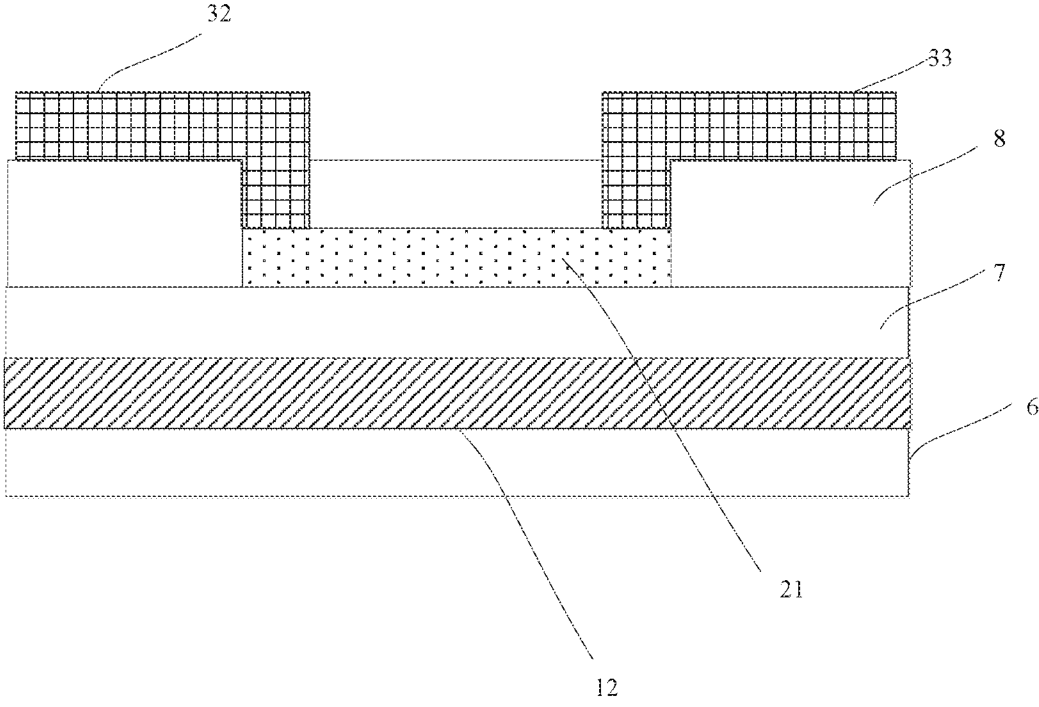
Figure 5:
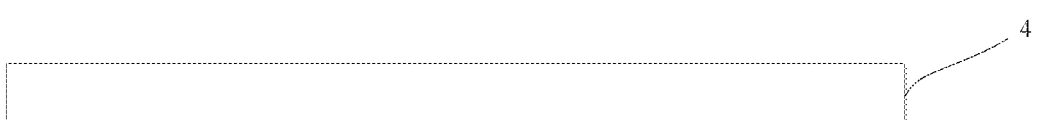
FIGS. 5 and 7 are schematic cross-sectional views of the display panel in the direction DD' in FIGS. 2*a* and 2*b* according to an embodiment of the present disclosure.
Figure 5:
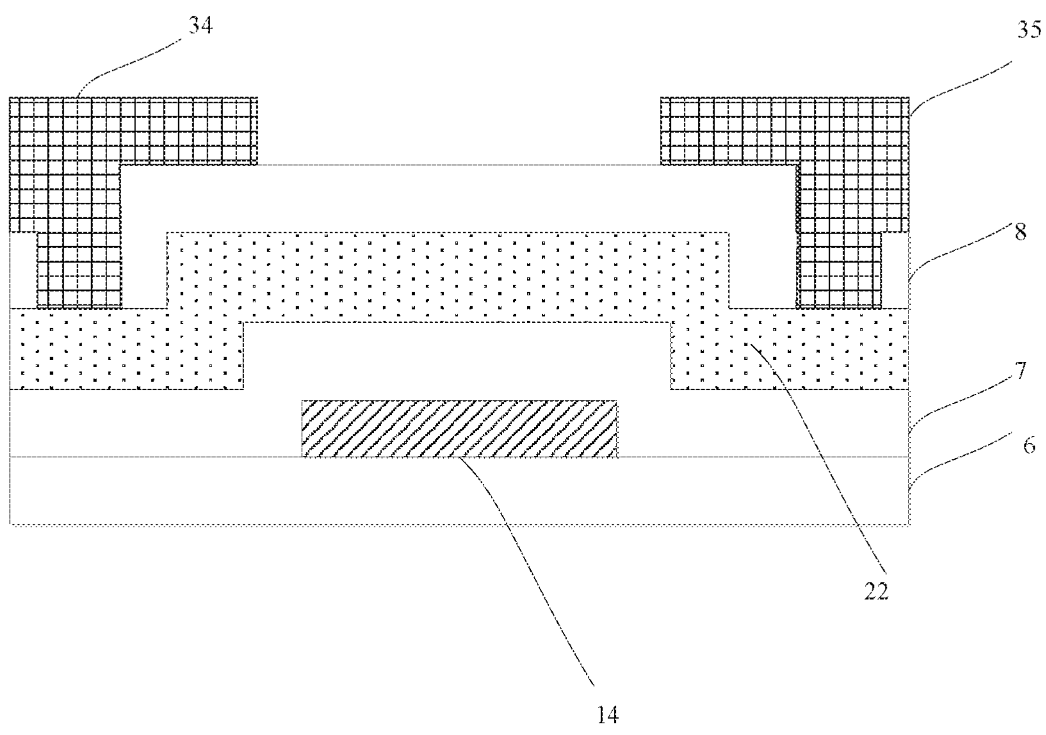
Figure 6:
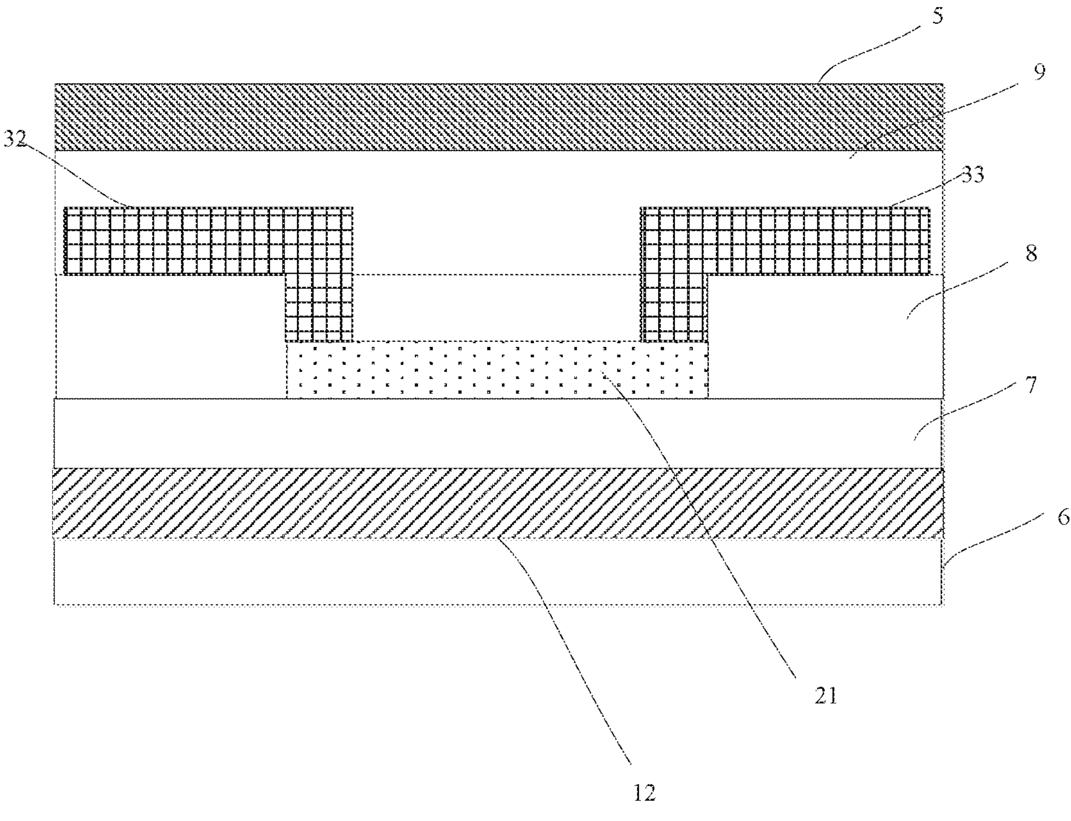
Figure 7:
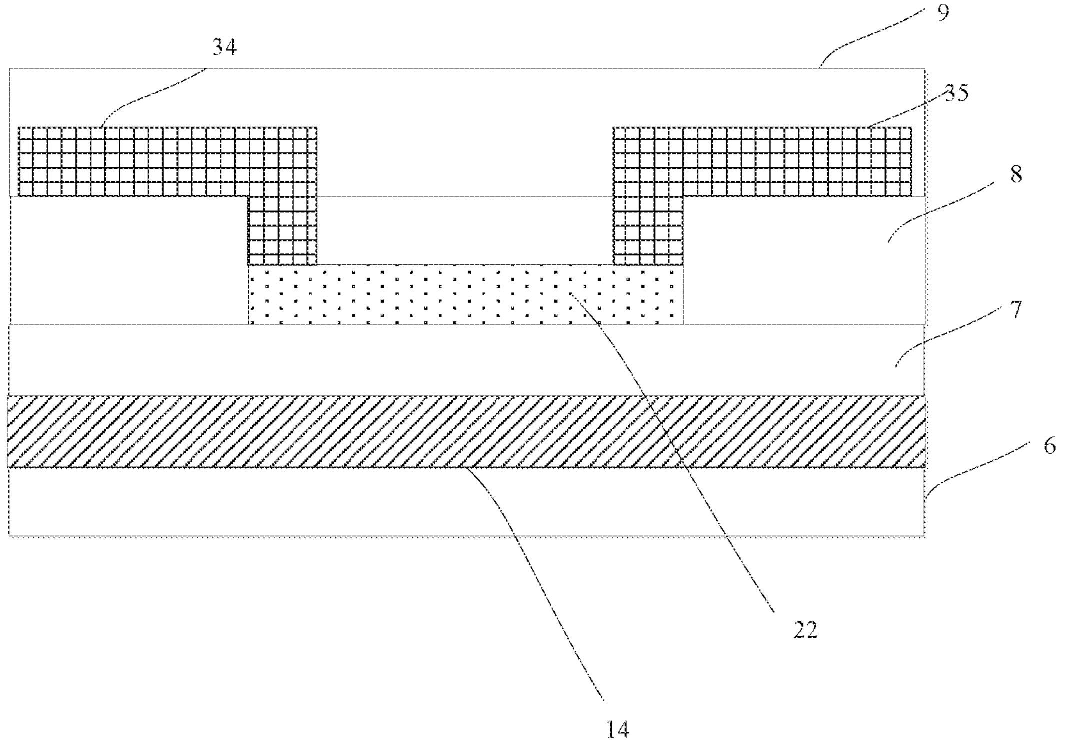

FIGS. 4 and 6 are schematic cross-sectional views of the display panel of the embodiment of the present disclosure in the direction of CC' in FIGS. 2*a* and 2*b*; FIGS. 5 and 7 are schematic cross-sectional views of the display panel of the embodiment of the present disclosure in the direction of DD' in FIGS. 2*a* and 2*b*.

In a specific example, the light shielding layer may be a black matrix. As shown in FIG. 4 and FIG. 5, the display panel further includes a pair of substrates opposite to each other, and the opposite substrate is located on a side of the display substrate close to the display side of the display panel. On the base substrate 4 of the opposite substrate, the black matrix 5 is not provided in the area corresponding to the photosensitive thin film transistor unit, and the black matrix 5 is provided in the area corresponding to the reference thin film transistor unit, so that the ambient light will not be illuminated on the reference thin film transistor, and illuminated on the photosensitive thin film transistor, after inputting a direct current signal to the first signal line 31, the intensity of the ambient light can be determined by comparing the currents of the second signal line I1 and the third signal line I2. In FIGS. 4 and 5, 6 denotes a base substrate, 7 denotes a gate insulating layer, and 8 denotes an interlayer insulating layer. The black matrix 5 may not be provided in the channel region of the active layer corresponding to the photosensitive thin film transistor unit, or the black matrix 5 may not be provided in the entire area of the active layer corresponding to the photosensitive thin film transistor unit, or the black matrix 5 is not provided in the entire area corresponding to the photosensitive thin film transistor unit.

In some embodiments, a buffer layer may also be arranged between the base substrate and the gate electrode.

In another specific example, as shown in FIG. 6 and FIG. 7, on the passivation layer 9 of the display substrate, the black matrix 5 is not provided in the area corresponding to the photosensitive thin film transistor unit, and the black matrix 5 is provided in the area corresponding to the reference thin film transistor unit. In this way, the ambient light will not be illuminated on the reference thin film transistor, but can be illuminated on the photosensitive thin film transistor. After inputting a DC signal to the first signal line 31, the intensity of ambient light is determined by comparing the current of the second signal line I1 and the current of the third signal line I2. In FIGS. 6 and 7, 6 denotes a base substrate, 7 denotes a gate insulating layer, and 8 denotes an interlayer insulating layer. The black matrix 5 may not be provided in the channel region of the active layer corresponding to the photosensitive thin film transistor unit, or the black matrix 5 may not be provided in the entire area of the active layer corresponding to the photosensitive thin film transistor unit, or the black matrix 5 is not provided in the entire area corresponding to the photosensitive thin film transistor unit.

In some embodiments, a buffer layer may also be arranged between the base substrate and the gate electrode.

In this embodiment, the thin film transistor (including the reference thin film transistor and the photosensitive thin film transistor) may be an N-type thin film transistor or a P-type thin film transistor. As shown in FIG. 3, the photosensitive thin film transistor unit and the reference thin film transistor unit may be formed by arranging N TFTs (e.g., TFT 1, TFT 2, . . . , TFT N) in parallel.

Embodiments of the present disclosure also provide a display device including the above-mentioned display panel. The display device includes but is not limited to: a radio frequency unit, a network module, an audio output unit, an input unit, a sensor, a display unit, a user input unit, an interface unit, a memory, a processor, and a power supply and other components. Those skilled in the art can understand that the structure of the above-mentioned display device does not constitute a limitation on the display device, and the display device may include more or less components described above, or combine some components, or arrange different components. In the embodiments of the present disclosure, the display device includes, but is not limited to, a display, a mobile phone, a tablet computer, a television, a wearable electronic device, a navigation display device, and the like.

The display device can be any product or component with a display function, such as a TV, a monitor, a digital photo frame, a mobile phone, a tablet computer, etc., wherein the display device further includes a flexible circuit board, a printed circuit board and a backplane.

In addition, the display device also includes:

- a signal input unit, configured to input a direct current signal or a square wave signal to the signal input end;
- a control unit, configured to respectively input a turn-on signal to the first control terminal and the second control terminal;
- a current detection unit, configured to detect the first current of the second signal line and the second current of the third signal line respectively; and
- a processing unit, configured to determine the intensity of ambient light according to values of the first current and the second current.

Figure 8:
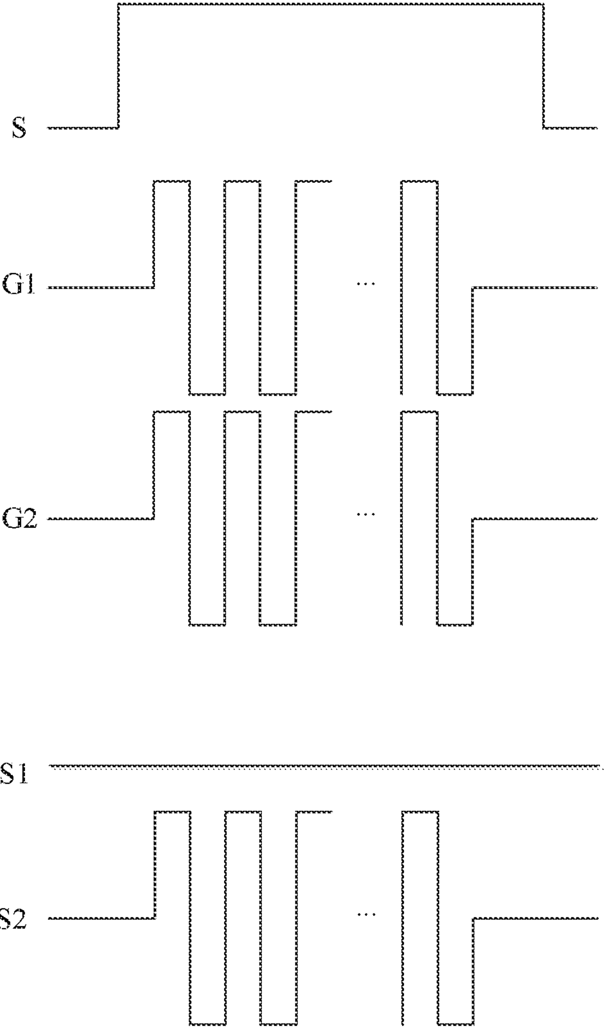
FIG. 8 is a schematic diagram of each signal according to an embodiment of the present disclosure.

In this embodiment, the direct current signal S is inputted to the signal input terminal, the turn-on signal G1 is inputted to the first control terminal, and a turn-on signal G2 is inputted to the second control terminal. When both G1 and G2 are at a high level or a low level, the reference film transistor and the photosensitive thin film transistor are turned on, enabling ambient light detection. However, if the reference thin film transistor and the photosensitive thin film transistor are turned on for a long time, the characteristic curve of the thin film transistor will be shifted, and correction is required, otherwise the detection accuracy will be affected; therefore, in this embodiment, as shown in FIG. 8, the turn-on signals G1 and G2 are square wave signals instead of DC voltage signals, so that the characteristic curve of the thin film transistor will not be shifted, and the accuracy of detection can be guaranteed without adding a correction algorithm.

In some embodiments, the frequency of the square wave signal may be consistent with the refresh rate of the display screen. For example, if the display time of each frame of the display screen is 1/60 second, the period of the square wave signal is also 1/60 second. In one period of the square wave signal, it is divided into two time phases, one of which is low level and the other is high level. The time of the two time phases can be equal or unequal. If the time of the two time phases is equal, that is, the proportion of the two time phases in one period is 50%, and the time of the two time phases is equal, during the ambient light detection time, the turn-on time and turn-off time of the reference thin film transistor and the photosensitive thin film transistor are equal, and the accuracy of the detection results will not be affected by the short turn-on time, the characteristic curve of the thin film transistor will not be biased due to the long turn-on time, to ensure the detection accuracy.

The reference thin film transistor and the photosensitive thin film transistor can be P-type thin film transistors or N-type thin film transistors, but the reference thin film transistor and the photosensitive thin film transistor are of the same type. If the reference thin film transistor and the photosensitive thin film transistor are N-type thin film transistors, the turn-on signal is a high level signal; if the reference thin film transistor and the photosensitive thin film transistor are P-type thin film transistors, the turn-on signal is a low level signal.

When the reference thin film transistor and the photosensitive thin film transistor are turned off, the reference thin film transistor and the photosensitive thin film transistor are not detected. Therefore, when the reference thin film transistor and the photosensitive thin film transistor are turned off, as shown in FIG. 8, a low level signal S1 can also be inputted to the signal input terminal. The square wave signal S2 with the same frequency as G1 and G2 can also be inputted to the signal input terminal, and it is not limited to inputting the direct current signal S to the signal input terminal.

The above-mentioned low level signal may be an electrical signal with a voltage of 0, or may be an electrical signal with a voltage value lower than a threshold value.

In this embodiment, the current detection unit and/or the processing unit may be specifically implemented by a signal processing module, and the reference electrical signal Iin1 outputted by the second signal line and the detection electrical signal Iin2 outputted by the third signal line may be collected by the signal processing module, the reference electrical signal Iin1 and the detection electrical signal Iin2 are amplified, and the first signal difference Vout between the amplified reference electrical signal Iin1 and the detection electrical signal Iin2 is obtained, and the brightness of the ambient light is determined according to the first signal difference Vout.

Specifically, the signal processing module may be composed of any circuit, and/or any chip.

Specifically, since the currents of the reference electrical signal Iin1 outputted by the second signal line and the detection electrical signal Iin2 outputted by the third signal line are very small, it is inconvenient to process the currents outputted by the second signal line and the third signal line. The signal processing module amplifies the currents outputted by the second signal line and the third signal line respectively.

Figure 9:
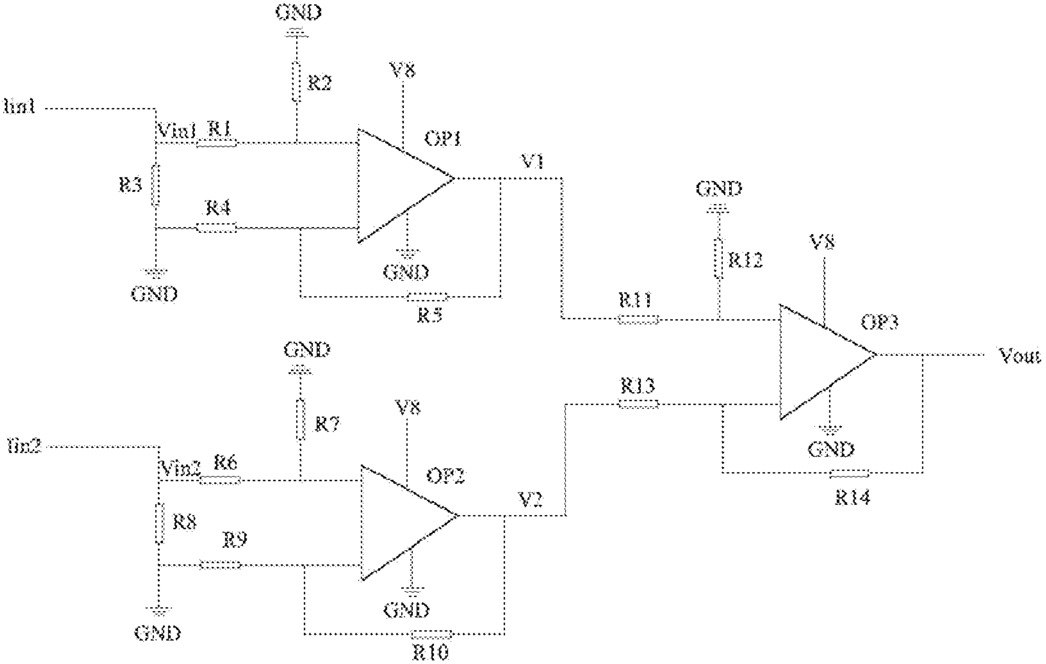
FIG. 9 is a schematic circuit diagram of detecting the electrical signals outputted by the second signal line and the third signal line according to an embodiment of the present disclosure.

Optionally, as shown in FIG. 9, the signal processing module may include: a first operational amplifier OP1, the first input terminal of the first operational amplifier OP1 is connected to the third signal line, and the second input terminal of the first operational amplifier OP1 is grounded, the first operational amplifier OP1 is configured to amplify the reference electrical signal Iin1 into a first voltage V1; the second operational amplifier OP2, the first input terminal of the second operational amplifier OP2 is connected to the second signal line, the second input terminal of the second operational amplifier OP2 is grounded, and the second operational amplifier OP2 is configured to amplify the detection electrical signal Iin2 into a second voltage V2; the subtractor OP3, the first input terminal of the subtractor OP3 is connected to the output terminal of the first operational amplifier OP1, the second input terminal of the subtractor OP3 is connected to the output terminal of the second operational amplifier OP2, the subtractor OP3 is configured to perform subtraction processing on the first voltage V1 and the second voltage V2 into a first voltage difference, the first voltage difference is used as the first signal difference Vout.

In an embodiment of the present disclosure, as shown in FIG. 9, the signal processing module may further include: a first resistor R1, a second resistor R2, a third resistor R3, a fourth resistor R4, a fifth resistor R5, a sixth resistor R6, a seventh resistor R7, an eighth resistor R8, a ninth resistor R9, a tenth resistor R10, an eleventh resistor R11, a twelfth resistor R12, a thirteenth resistor R13, and a fourteenth resistor R14. One end of the first resistor R1 is connected to the third signal line, the other end of the first resistor R1 is connected to the first input terminal of the first operational amplifier OP1; one end of the second resistor R2 is connected to the other end of the first resistor R1, the other end of the second resistor R2 is grounded; one end of the third resistor R3 is connected to one end of the first resistor R1, and the other end of the third resistor R3 is grounded; one end of the fourth resistor R4 is connected to the other end of the third resistor R3, the other end of the fourth resistor R4 is connected to the second input terminal of the first operational amplifier OP1; one end of the fifth resistor R5 is connected to the other end of the fourth resistor R4, and the other end of the fifth resistor R5 is connected to the output terminal of the first operational amplifier OP1. One end of the sixth resistor R6 is connected to the second signal line, the other end of the sixth resistor R6 is connected to the first input terminal of the second operational amplifier OP2; one end of the seventh resistor R7 is connected to the other end of the sixth resistor R6, the other end of the seventh resistor R7 is grounded; one end of the eighth resistor R8 is connected to one end of the sixth resistor R6, and the other end of the eighth resistor R8 is grounded; one end of the ninth resistor R9 is connected to the other end of the eighth resistor R8, the other end of the ninth resistor R9 is connected to the second input terminal of the second operational amplifier OP2; one end of the tenth resistor R10 is connected to the other end of the ninth resistor R9, and the other end of the tenth resistor R10 is connected to the output terminal of the second operational amplifier OP2. One end of the eleventh resistor R11 is connected to the output terminal of the first operational amplifier OP1, the other end of the eleventh resistor R11 is connected to the first input terminal of the subtractor OP3; one end of the twelfth resistor R12 is connected to the other end of the eleventh resistor R11, the other end of the twelfth resistor R12 is ground; one end of the thirteenth resistor R13 is connected to the output terminal of the second operational amplifier OP2, and the other end of the thirteenth resistor R13 is connected to the second input terminal of the subtractor OP3; one end of the fourteenth resistor R14 is connected to the other end of the thirteenth resistor R13, and the other end of the fourteenth resistor R14 is connected to the output terminal of the subtractor OP3; the power supply terminal of the first operational amplifier OP1, the power supply terminal of the second operational amplifier OP2 and the power supply terminal of the subtractor OP3 input an eighth voltage V8, wherein the eighth voltage V8 can be provided by a power supply module. The third resistor R3 converts the reference electrical signal Iin1 into a voltage signal, and the eighth resistor R8 converts the detection electrical signal Iin2 into a voltage signal.

The resistance value of the first resistor R1, the resistance value of the fourth resistor R4, the resistance value of the sixth resistor R6 and the resistance value of the ninth resistor R9 may be the same, the resistance value of the second resistor R2, the resistance value of the fifth resistor R5, the resistance value of the seventh resistor R7 and the resistance value of the tenth resistor R10 may be the same, and the resistance value of the third resistor R3 and the resistance value of the eighth resistor R8 may be the same. The resistance value of the eleventh resistor R11, the resistance value of the twelfth resistor R12, the resistance value of the thirteenth resistor R13, and the resistance value of the fourteenth resistor R14 may be the same.

Optionally, the resistance value of the first resistor R1 can be much larger than the resistance value of the third resistor R3, and the resistance value of the sixth resistor R6 can be much larger than the resistance value of the eighth resistor R8, so as to ensure that the current signal outputted by the third signal line flows through the third resistor R3, and the current signal outputted by the second signal line flows through the eighth resistor R8, which improves the accuracy of the first voltage difference. When the reference electrical signal Iin1 and the detection electrical signal Iin2 are too small, if the subtractor OP3 directly subtracts the reference electrical signal Iin1 and the detection electrical signal Iin2, the difference between the reference electrical signal Iin1 and the detection electrical signal Iin2 is also too small, which is not conducive to identifying the difference. Through the first resistor R1, the fourth resistor R4, the sixth resistor R6, the ninth resistor R9, the second resistor R2, the fifth resistor R5, the seventh resistor R7, the tenth resistor R10, after the first operational amplifier OP1 and the second operational amplifier OP2 amplifies the reference electrical signal Iin1 and the detection electrical signal Iin2, the first voltage difference can be easily identified.

Specifically, the first input terminal voltage of the first operational amplifier OP1 is $Vin1=Iin1\times R3$, wherein R3 is the resistance value of the third resistor, and the first input terminal voltage of the second operational amplifier OP2 is $Vin2=Iin2\times R8$, wherein, R8 is the resistance value of the eighth resistor.

Specifically, the output terminal voltage of the first operational amplifier OP1 is $V1=(R5/R1)\times Vin1$, wherein R5 is the resistance value of the fifth resistor, R1 is the resistance value of the first resistor, and the output terminal voltage of the second operational amplifier OP2 is $V2=(R10/R6)\times Vin2$, wherein, R6 is the resistance value of the sixth resistor, and R10 is the resistance value of the tenth resistor. The voltage of the first input terminal of the subtractor OP3 is V1, the voltage of the second input terminal of the subtractor OP3 is V2, and the voltage of the output terminal of the subtractor OP3 is Vout.

In a specific embodiment of the present invention, the resistance value of the first resistor R1, the resistance value of the fourth resistor R4, the resistance value of the sixth resistor R6 and the resistance value of the ninth resistor R9 may be 100K ohms, the resistance value of the second resistor R2, the resistance value of the fifth resistor R5, the resistance value of the seventh resistor R7 and the resistance value of the tenth resistor R10 can be 2M ohms, the resistance value of the third resistor R3 and the resistance value of the eighth resistor R8 can be 2K Ohm, the resistance value of the eleventh resistor R11, the resistance value of the twelfth resistor R12, the resistance value of the thirteenth resistor R13 and the resistance value of the fourteenth resistor R14 can be 100K ohms, the first operational amplifier OP1, the second operational amplifier OP2 and the subtractor OP3 can be the chip OPA177. Therefore, the first operational amplifier OP1 can amplify the voltage signal converted from the reference electrical signal Iin1 by 20 times, and the second operational amplifier OP2 can amplify the voltage signal converted from the detection electrical signal Iin2 by 20 times. Assuming that the reference electrical signal Iin1 is a current in the range of 70 uA to 100 uA, the first operational amplifier OP1 outputs the first voltage V1 in the range of 140 mV-200 mV. Assuming that the range of the difference between the reference electrical signal Iin1 and the detection electrical signal Iin2 is 2.5 uA to 30 uA, or the range of the difference between the voltage signal converted from the reference electrical signal Iin1 and the voltage signal converted from the detection electrical signal Iin2 is 5 mV to 60 mV. Then, the first voltage difference outputted by the subtractor OP3 is in the range of 0.1V to 1.2V, which falls within the identifiable voltage range. In one embodiment of the present invention, the identifiable voltage range may be 0.1V to 2.5V.

Embodiments of the present disclosure also provide a method of manufacturing a display panel, the display panel includes a display substrate, the display substrate includes a base substrate, the base substrate has a display area and a peripheral area, and the display area includes a plurality of pixel units arranged in array, the plurality of pixel units are arranged in a row direction and a column direction, and the method includes:

Forming a photosensitive thin film transistor structure in the peripheral area, wherein the photosensitive thin film transistor structure includes a reference thin film transistor unit and a photosensitive thin film transistor unit, the reference thin film transistor unit includes a plurality of reference thin film transistors, and the photosensitive thin film transistor unit includes a plurality of photosensitive thin film transistors;

Forming a light shielding layer on a side of the photosensitive thin film transistor structure close to a display side of the display panel, wherein an orthographic projection of the reference thin film transistor on the base substrate is located within an orthographic projection of the light shielding layer on the base substrate, at least part of an orthographic projection of a channel region of the photosensitive thin film transistor on the base substrate does not overlap the orthographic projection of the light shielding layer on the base substrate;

Connecting a first electrode of the reference thin film transistor and a first electrode of the photosensitive thin film transistor to a signal input terminal of the photosensitive thin film transistor structure; connecting a second electrode of the reference thin film transistor to a second signal line of the photosensitive thin film transistor structure, connecting a second electrode of the photosensitive thin film transistor to a third signal line of the photosensitive thin film transistor structure; connecting a gate electrode of the reference thin film transistor to a first control terminal of the photosensitive thin film transistor structure, connecting a gate electrode of the photosensitive thin film transistor to a second control terminal of the photosensitive thin film transistor structure.

In this embodiment, the peripheral area of the display panel is provided with a photosensitive thin film transistor structure, the photosensitive thin film transistor structure includes a reference thin film transistor unit and a photosensitive thin film transistor unit, the reference thin film transistor unit includes a plurality of reference thin film transistors, and the photosensitive thin film transistor unit includes a plurality of photosensitive thin film transistors, a light shielding layer is provided on the side of the reference thin film transistor away from the base substrate of the display panel to shield the reference thin film transistor, so that the reference thin film transistor will not be affected by ambient light; at least part of the channel region of the photosensitive thin film transistor that is not far from the base substrate is not shielded by the light shielding layer, and the photosensitive thin film transistor can receive external light; wherein, the first electrodes of the reference thin film transistor and the photosensitive thin film transistor are both connected to the signal input terminal of the photosensitive thin film transistor structure; the second electrode of the reference thin film transistor is connected to the second signal line of the photosensitive thin film transistor structure; the second electrode of the photosensitive thin film transistor is connected to the third signal line of the photosensitive thin film transistor structure; the gate electrode of the reference thin film transistor is connected to the first control terminal of the photosensitive thin film transistor structure, and the gate electrode of the photosensitive thin film transistor is connected to the second control terminal of the photosensitive thin film transistor structure. During ambient light detection, an electrical signal is inputted to the signal input terminal, the current of the second signal line and the current of the third signal line are compared by detecting the current of the second signal line and the current of the third signal line, and the effect of ambient light on the photosensitive thin film transistor is obtained, and then the brightness of the ambient light can be calculated. In this embodiment, a photosensitive thin film transistor structure is integrated on the display panel, instead of an additional photosensitive sensor on the display device, which can reduce the cost of the display device, save the space occupied by the photosensitive sensor, and increase the product competition of the display device.

When the photosensitive thin film transistor is used to detect ambient light, the channel region of the photosensitive thin film transistor is used to detect light, wherein the active layer includes a source region, a drain region, and a channel region between a source region and a drain region, the source region is the region where the active layer contacts the source electrode, the drain region is the region where the active layer contacts the drain electrode, the channel region corresponds to the gap between the source electrode and the drain electrode, and is between the source region and the drain region. Therefore, at least the light shielding layer close to the display side of the channel region needs to be removed to expose the channel region of the photosensitive thin film transistor.

In this embodiment, the photosensitive thin film transistor structure includes a reference thin film transistor unit and a photosensitive thin film transistor unit, and the reference thin film transistor of the reference thin film transistor unit is shielded by the light shielding layer, so that the direct current signal is inputted to the reference thin film transistor unit, and the current detected from the second signal line can be used as the reference current; the channel region of the photosensitive thin film transistor of the photosensitive thin film transistor unit is not shielded by the light shielding layer, when the ambient light illuminates the photosensitive thin film transistor unit, the characteristic of the photosensitive thin film transistor unit will be affected, and the current outputted by the third signal line will change, and by comparing the current detected from the third signal line with the reference current, the influence of light on the thin film transistor can be determined, so that the brightness of the ambient light can be obtained. In order to ensure the detection accuracy, the parameters of the photosensitive thin film transistor and the reference thin film transistor should be consistent. Components of the photosensitive thin film transistor and the reference thin film transistor (including the gate electrode, a first electrode, a second electrode and an active layer) are made of the same material and have the same dimensions.

In order not to affect the display of the display panel, the photosensitive thin film transistor structure is arranged in the peripheral area of the display panel. As shown in FIG. 1, the peripheral area includes a first peripheral area S2 and a second peripheral area S3 located on opposite sides of the display area S1 respectively. The second peripheral area S3 is used to bind the circuit board. The photosensitive thin film transistor structure is arranged at a position of the first peripheral area S2 close to the display area. Forming the photosensitive thin film transistor structure includes:

Forming the photosensitive thin film transistor structure at a position of the first peripheral area close to the display area.

Because when the display panel is applied to a display product such as a handheld mobile terminal, the user will not block the first peripheral area S2 above the display area S1 when the user uses the display product, the photosensitive thin film transistor structure is arranged in the first peripheral area S2, the photosensitive thin film transistor structure can receive the ambient light, so as to detect the ambient light. In addition, the second peripheral area S3 is used to bind the circuit board, and the signal lines for transmitting display signals extend from the second peripheral area S3 to the display area S1, but not to the first peripheral area S2, so that the photosensitive thin film transistor structure is arranged in the first peripheral area S2, and there is no risk of coupling with the signal line. The arrangement of the photosensitive thin film transistor structure will not affect the signal on the signal line, and thus will not affect the display; in addition, the signal transmitted on the signal line will not affect the detection result of the photosensitive thin film transistor structure, which can ensure the accuracy of the detection result of the photosensitive thin film transistor structure.

If the photosensitive thin film transistor structure is arranged in the second peripheral area S3, on the one hand, when the display product is used, the user's body will block part of the ambient light, causing the ambient light received by the photosensitive thin film transistor structure to be inconsistent with the actual ambient light; on the other hand, there is a signal line in the second peripheral area S3, and the photosensitive thin film transistor structure is arranged in the first peripheral area S2, there is a risk of coupling with the signal line, which further affects the accuracy of the detection result.

When making reference thin film transistors and photosensitive thin film transistors, individual differences are unavoidable due to process limitations. In order to reduce the influence of individual differences on the detection results, a plurality of reference thin film transistors can be made to form a reference thin film transistor unit, and a plurality of photosensitive thin film transistors can be made to form the photosensitive thin film transistor unit, and the number of photosensitive thin film transistors included in the photosensitive thin film transistor unit is consistent with the number of reference thin film transistors included in the reference thin film transistor unit. Specifically, the reference thin film transistor unit may include more than 100 reference thin film transistors, such as 300 reference thin film transistors; the photosensitive thin film transistor unit may include more than 100 photosensitive thin film transistors, such as 300 photosensitive thin film transistors, which can reduce influence of individual differences of thin film transistors on detection results.

Since the reference thin film transistor unit includes hundreds of reference thin film transistors, and the photosensitive thin film transistor unit includes hundreds of photosensitive thin film transistors, the entire photosensitive thin film transistor structure needs to occupy a certain area on the display panel. In some embodiments, the width of the photosensitive thin film transistor structure in the column direction can be 5 um and the length thereof in the row direction can be 15 mm.

In addition, the minimum distance between the photosensitive thin film transistor structure and an edge of the display area can be 3-5 um, and the process limit needs to be considered to reserve space for the thin film transistor circuit.

The reference thin film transistor unit may include a plurality of reference thin film transistors arranged in multiple rows and multiple columns, and the photosensitive thin film transistor unit may include a plurality of photosensitive thin film transistors arranged in multiple rows and multiple columns. In order to facilitate the production of the reference thin film transistor and the photosensitive thin film transistor, the orthographic projection of the reference thin film transistor on the base substrate does not overlap the orthographic projection of the photosensitive thin film transistor on the base substrate, and the reference thin film transistor and the photosensitive thin film transistor can be located in the same layer, that is, the active layer of the reference thin film transistor and the active layer of the photosensitive thin film transistor are located in the same layer, the source and drain electrodes of the reference thin film transistor are located in the same layer as the source and drain electrodes of the photosensitive thin film transistor, the gate electrode of the reference thin film transistor and the gate electrode of the photosensitive thin film transistor are located in the same layer, and the gate insulating layer of the reference thin film transistor is located in the same layer as the gate insulating layer of the photosensitive thin film transistor, so that the active layer of the reference thin film transistor and the active layer of the photosensitive thin film transistor can be made by one patterning process, and the source and drain electrode of the reference thin film transistor and the source and drain electrode of the photosensitive thin film can be made by one patterning process, the gate electrode of the reference thin film transistor and the gate electrode of the photosensitive thin film transistor are made by one patterning process, and the gate insulating layer of the reference thin film transistor and the gate insulating layer of the photosensitive thin film transistor are made by one patterning process. The number of patterning processes is reduced. On the other hand, the reference thin film transistor and the photosensitive thin film transistor have high consistency in light receiving conditions other than for receiving ambient light differently, which can improve the detection accuracy.

The reference thin film transistor and the photosensitive thin film transistor can be aligned in the row direction or the column direction. For example, the reference thin film transistor unit includes ten rows and ten columns of reference thin film transistors, and the photosensitive thin film transistor unit includes ten rows and ten columns of photosensitive thin film transistors. The kth row of reference thin film transistors of the reference thin film transistor unit are located on the same straight line as the kth row of photosensitive thin film transistors of the photosensitive thin film transistor unit, or the jth column of reference thin film transistors of the reference thin film transistor unit are located on the same straight line as the jth column of the photosensitive thin film transistors of the photosensitive thin film transistor unit, and k, j are integers greater than 0 and less than or equal to 10. The number of rows and columns of the reference thin film transistors included in the reference thin film transistor unit may be the same as the number of rows and columns of the photosensitive thin film transistors included in the photosensitive thin film transistor unit, or may be the different from the number of rows and columns of the photosensitive thin film transistors included in the photosensitive thin film transistor unit. It should be noted that, the row direction may be consistent with the row direction of the plurality of pixel units, and the column direction may be consistent with the column direction of the plurality of pixel units.

The reference thin film transistor unit and the photosensitive thin film transistor unit may be symmetrical with respect to the axis of the display panel (such as the central axis of the display panel in the column direction), or may not be symmetrical with respect to the axis of the display panel, as long as the photosensitive thin film transistor unit can receive external light.

For a display panel provided with a backlight, in order to prevent the thin film transistor from being affected by the illumination of the backlight, the method of manufacturing the display panel further includes:

Forming a first light shielding pattern on a display side of the reference thin film transistor away from the display panel, wherein an orthographic projection of the active layer of the reference thin film transistor on the base substrate is located within the orthographic projection of the first light shielding pattern on the base substrate;

Forming a second light shielding pattern on a display side of the photosensitive thin film transistor away from the display panel, and wherein an orthographic projection of the active layer of the photosensitive thin film transistor on the base substrate is located within an orthographic projection of the second light shielding pattern on the base substrate.

When the photosensitive thin film transistor and the reference thin film transistor are located on the side of the display panel close to the display side, the first light shielding pattern is located on the side of the reference thin film transistor facing the base substrate, and the second light shielding pattern is located on a side of the photosensitive thin film transistor facing the base substrate. When the photosensitive thin film transistor and the reference thin film transistor are located on the side of the display panel away from the display side, the first light shielding pattern is located on the side of the reference thin film transistor away from the base substrate, and the second light shielding pattern is located at the photosensitive thin film transistor away from the base substrate.

In this way, the light of the backlight source can be prevented from illuminating the reference thin film transistor through the first light shielding pattern, and the light of the backlight source can be prevented from illuminating the photosensitive thin film transistor through the second light shielding pattern. An additional film layer can be added to make the first light shielding pattern and the second light shielding pattern, or the film layer of the photosensitive thin film transistor structure can be used to make the first light shielding pattern and the second light shielding pattern, which can simplify the photosensitive thin film transistor structure and production process.

The first light shielding pattern and the second light shielding pattern may be independent of each other, or may form an integral structure. The first light shielding pattern and the second light shielding pattern are an integral pattern to shield the light of the backlight source.

In some embodiments, when the gate electrode of the reference thin film transistor is located between the active layer and the base substrate, the first light shielding pattern may be located in the same layer and made of the same material as the gate electrode of the reference thin film transistor, and the gate electrode of the reference thin film transistor is generally made of opaque metal, which can shield light; when the gate electrode of the photosensitive thin film transistor is located between the active layer and the base substrate, the second light shielding pattern and the gate electrode of the photosensitive thin film transistor are located in the same layer and made of the same material, and the gate electrode of the photosensitive thin film transistor is generally made of opaque metal, which can shield light. In this way, there is no need to add a special film layer to make the first light shielding pattern and the second light shielding pattern.

When the first light shielding pattern and the gate electrode of the reference thin film transistor are located in the same layer and are made of the same material, the first light shielding pattern is made of a conductive and opaque material, and the first light shielding pattern and the gate electrode of the reference thin film transistor are an integral structure, the integral structure not only serves as the gate electrode of the reference thin film transistor to control the turn-off and turn-on of the reference thin film transistor, but also serves as the first light shielding pattern to shield the light on the side of the reference thin film transistor away from the display side of the display panel, for example the light of the backlight source is prevent from illuminating the reference thin film transistor; when the second light shielding pattern and the gate electrode of the photosensitive thin film transistor are located in the same layer and made of the same material, the second light shielding pattern is made of a conductive and opaque material, the second light shielding pattern and the gate electrode of the photosensitive thin film transistor are an integral structure. The integral structure not only serves as the gate electrode of the photosensitive thin film transistor to control the turn-off and turn-on of the photosensitive thin film transistor, but also serves as the second light shielding pattern to shield the light on the side of the photosensitive thin film transistor away from the display side of the display panel, for example, the light from the backlight source can be prevented from being illuminating the photosensitive thin film transistor.

The size of the first light shielding pattern and the second light shielding pattern can be designed as required, as long as it is ensured that the orthographic projection of the active layer of the reference thin film transistor on the base substrate is located within the orthographic projection of the first light shielding pattern on the base substrate and the orthographic projection of the active layer of the photosensitive thin film transistor on the base substrate is located within the orthographic projection of the second light shielding pattern on the base substrate. Further, the area of the orthographic projection area of the first light shielding pattern on the base substrate is larger than the area of the orthographic projection area of the active layer of the reference thin film transistor on the base substrate, and the area of the orthographic projection of the second light shielding pattern on the base substrate is larger than the area of the orthographic projection area of the active layer of the photosensitive thin film transistor on the base substrate, so as to avoid the light from a side of the photosensitive thin film transistor structure away from the display side of the display panel from obliquely illuminating to the active layer of the photosensitive thin film transistor and the active layer of the reference thin film transistor, which can effectively shield the photosensitive thin film transistor structure.

In the display products of the related art, the photosensitive thin film transistor structure is not arranged in the peripheral area of the display panel, and a light shielding layer is formed in the peripheral area or on the color filter substrate or package cover of the display panel to shield the circuits in the peripheral area. In the technical solution, since the photosensitive thin film transistor unit needs to receive external light, it is necessary to remove at least part of the light shielding layer of the photosensitive thin film transistor close to the display side, so that the channel region of the photosensitive thin film transistor of the photosensitive thin film transistor unit can be exposed. The film layers of the photosensitive thin film transistor unit, such as the gate electrode, the source electrode and the drain electrode, are made of metal. If too many light shielding layers are removed, there will be a problem of bright lines caused by light reflection.

In some embodiments, the light shielding layer is located on the display substrate, and is located on the side of the photosensitive thin film transistor facing the display side of the display panel, the light shielding layer needs to be partially removed, so that ambient light can be irradiated to the photosensitive thin film transistor unit; in some embodiments, the light shielding layer is located on an opposite substrate of the display substrate, and the opposite substrate is located on the display side of the display substrate, the light shielding layer needs to be partially removed so that ambient light can be irradiated to the photosensitive thin film transistor unit; in some embodiments, the light shielding layer includes a first light shielding layer arranged on the display substrate, and also includes a second light shielding layer arranged on the opposite substrate, and both the first light shielding layer and the second light shielding layer are located at a side of the photosensitive thin film transistor facing the display side of the display panel. At this time, both the first light shielding layer and the second light shielding layer need to be partially removed, so that ambient light can be irradiated to the photosensitive thin film transistor unit.

In this embodiment, the width to length ratio of the channel region of the photosensitive thin film transistor can be designed to be less than or equal to 5/4. As shown in FIG. 2*a* and FIG. 2*b*, the size of the channel region of the active layer 22 of the photosensitive thin film transistor in the row direction is the length of the channel region, and the size of the channel region of the active layer 22 of the photosensitive thin film transistor in the column direction is the width of the channel region, wherein the channel region of the active layer 22 of the photosensitive thin film transistor is a part of active Layer 22 corresponding to the gap between source electrode 34 and drain electrode 35. The plurality of photosensitive thin film transistors included in the photosensitive thin film transistor unit can be located in the same row, so that the width of the channel region of the photosensitive thin film transistor unit in the column direction is only Sum or less, which is much smaller than the width of the pixel of 30 um, so that a part of the peripheral area where the light shielding layer is not provided, that is, the opening of the light shielding layer is only a slit, and the problem of bright lines caused by light reflection will not occur. It should be noted that, the row direction may be consistent with the row direction of the plurality of pixel units, and the column direction may be consistent with the column direction of the plurality of pixel units.

The display area of the display panel is provided with thin film transistors for display, including driving thin film transistors and switching thin film transistors, etc. The gate electrode of the reference thin film transistor, the gate electrode of the photosensitive thin film transistor and the gate electrode of the thin film transistor for display are located in the same layer and made of the same material; and/or, the first electrode of the reference thin film transistor, the first electrode of the photosensitive thin film transistor and the first electrode of the thin film transistor for display are located in the same layer and made of the same material and/or, the second electrode of the reference thin film transistor, the second electrode of the photosensitive thin film transistor and the second electrode of the thin film transistor for display are located in the same layer and made of the same material.

The first electrode may be one of the source electrode and the drain electrode, and the second electrode may be the other of the source electrode and the drain electrode.

In some embodiments, the method of manufacturing the display panel includes:

- forming the gate electrode of the reference thin film transistor, the gate electrode of the photosensitive thin film transistor and the gate electrode of the thin film transistor for display by one patterning process;
- forming the first electrode of the reference thin film transistor, the first electrode of the photosensitive thin film transistor and the first electrode of the thin film transistor for display by one patterning process;
- forming the second electrode of the reference thin film transistor, the second electrode of the photosensitive thin film transistor and the second electrode of the thin film transistor for display by one patterning process.

In this way, the manufacturing process of the display panel can be simplified, the production cost of the display panel can be reduced, and the production efficiency of the display panel can be improved.

It should be noted that each embodiment in this specification is described in a progressive manner, and the same and similar parts between the various embodiments may be referred to each other, and each embodiment focuses on the differences from other embodiments. In particular, for the method embodiment, since it is basically similar to the product embodiment, the description is relatively simple, and the relevant part can be referred to the part of the description of the product embodiment.

Unless otherwise defined, technical or scientific terms used in this disclosure shall have the ordinary meaning as understood by those ordinary skill in the art to which this disclosure belongs. As used in this disclosure, "first," "second," and similar terms do not denote any order, quantity, or importance, but are merely used to distinguish the various components. "Including" or "comprising" and similar words mean that the elements or things appearing before the word encompass the elements or things recited after the word and their equivalents, but do not exclude other elements or things. Words like "connected" or "coupled" are not limited to physical or mechanical connections, but may include electrical connections, whether direct or indirect. "Up", "Down", "Left", "Right", etc. are only used to represent the relative positional relationship, and when the absolute position of the described object changes, the relative positional relationship may also change accordingly.

It will be understood that when an element such as a layer, film, region or substrate is referred to as being "on" or "under" another element, it can be "directly on" or "under" the other element, or there are intermediate elements.

In the description of the embodiments, the particular features, structures, materials or characteristics may be combined in any suitable manner in any one or more of the embodiments or examples.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. A display panel, comprising a display substrate, wherein the display substrate comprises a base substrate, the base substrate comprises a display area and a peripheral area, the peripheral area is provided with a photosensitive thin film transistor structure, the photosensitive thin film transistor structure comprises a reference thin film transistor unit and a photosensitive thin film transistor unit, and the reference thin film transistor unit comprises a plurality of reference thin film transistors, the photosensitive thin film transistor unit comprises a plurality of photosensitive thin film transistors;

- a light shielding layer is arranged on a side of the photosensitive thin film transistor structure close to a display side of the display panel, wherein an orthographic projection of the reference thin film transistor on the base substrate is located within an orthographic projection of the light shielding layer on the base substrate, at least part of an orthographic projection of a channel region of the photosensitive thin film transistor on the base substrate does not overlap the orthographic projection of the light shielding layer on the base substrate;
- first electrodes of the reference thin film transistor and the photosensitive thin film transistor are both connected to a signal input terminal of the photosensitive thin film transistor structure; a second electrode of the reference thin film transistor is connected to a second signal line of the photosensitive thin film transistor structure, a second electrode of the photosensitive thin film transistor is connected to a third signal line of the photosensitive thin film transistor structure; a gate electrode of the reference thin film transistor is connected to a first control terminal of the photosensitive thin film transistor structure, a gate electrode of the photosensitive thin film transistor is connected to a second control terminal of the photosensitive thin film transistor structure;
- wherein the peripheral area comprises a first peripheral area and a second peripheral area, and the first peripheral area and the second peripheral area are respectively located on opposite sides of the display area, the photosensitive thin film transistor structure is located in the first peripheral area, the first peripheral area is provided with a third connection line, and the second peripheral area is provided with a first terminal,
- the gate electrode of the reference thin film transistor and the gate electrode of the photosensitive thin film transistor are both connected to the third connection line, the third connection line is connected to a third line in a different layer through a via hole, the third connection line is connected to a fifth connection line in a different layer through a via hole, the fifth connection line extends to the second peripheral area and is connected to the first terminal, and the first terminal is configured to input a control signal to the gate electrode of the reference thin film transistor and the gate electrode of the photosensitive thin film transistor.

2. The display panel according to claim 1, wherein the second peripheral area is configured to bind a circuit board, the photosensitive thin film transistor structure is arranged at a position of the first peripheral area close to the display area.

3. The display panel according to claim 1, further comprising:

- a first light shielding pattern, located on a side of the reference thin film transistor away from the display side of the display panel, wherein an orthographic projection of an active layer of the reference thin film transistor on the base substrate is located within an orthographic projection of the first light shielding pattern on the base substrate;

a second light shielding pattern, located on a side of the photosensitive thin film transistor away from the display side of the display panel, and wherein an orthographic projection of an active layer of the photosensitive thin film transistor on the base substrate is located within an orthographic projection of the second light shielding pattern on the base substrate.

4. The display panel according to claim 3, wherein, the first light shielding pattern and the gate electrode of the reference thin film transistor are arranged in a same layer and made of a same material;

the second light shielding pattern and the gate electrode of the photosensitive thin film transistor are located in a same layer and made of a same material.

5. The display panel according to claim 1, wherein, the reference thin film transistor unit comprises N reference thin film transistors;

the photosensitive thin film transistor unit comprises N photosensitive thin film transistors, wherein N is an integer greater than 100.

6. The display panel according to claim 1, wherein a width to length ratio of a channel region of the photosensitive thin film transistor is less than or equal to 5/4.

7. The display panel according to claim 1, wherein the display area is provided with a thin film transistor for display, the gate electrode of the reference thin film transistor, the gate electrode of the photosensitive thin film transistor and a gate electrode of the thin film transistor for display are located in a same layer and made of a same material; and/or the first electrode of the reference thin film transistor, the first electrode of the photosensitive thin film transistor and a first electrode of the thin film transistor for display are located in a same layer and made of a same material; and/or the second electrode of the reference thin film transistor, the second electrode of the photosensitive thin film transistor and a second electrode of the thin film transistor for display are located in a same layer and made of a same material.

8. The display panel according to claim 1, wherein, the gate electrode of the reference thin film transistor and the first light shielding pattern are formed in an integral structure, and a whole shape is a long strip extending in a row direction;

the gate electrode of the photosensitive thin film transistor and the second light shielding pattern are formed in an integral structure, and a whole shape is a long strip extending along the row direction;

the first light shielding pattern is connected to the second light shielding pattern, and the third connection line, the first light shielding pattern and the second light shielding pattern are arranged on a same layer and formed in an integral structure;

a line width of the third connection line is smaller than a line width of the first light shielding pattern and the second light shielding pattern.

9. The display panel according to claim 3, wherein the peripheral area is further provided with a second connection line and a fourth connection line, and the second peripheral area is provided with a second terminal and a fourth terminal;

wherein the fourth connection line is connected to the second signal line and the second terminal;

the second connection line is connected to the third signal line and the fourth terminal.

10. The display panel according to claim 9, wherein the fourth connection line and the second connection line are located on two sides of the display area respectively.

11. A display device, comprising the display panel according to claim 1.

12. The display device according to claim 11, further comprising:

a signal input unit, configured to input a direct current signal or a square wave signal to the signal input end;

a control unit, configured to input a turn-on signal to the first control terminal and the second control terminal;

a current detection unit, configured to detect a first current of the second signal line and a second current of the third signal line; and a processing unit, configured to determine an intensity of ambient light according to values of the first current and the second current.

13. The display device according to claim 12, wherein the turn-on signal is the square wave signal.

14. The display device according to claim 13, wherein one period of the square wave signal is divided into two time phases, one of the two time phases is a high level, the other of the two time phases is a low level, and a proportion of each time phase in one period is 50%, and a frequency of the turn-on signal is consistent with a refresh frequency of a display screen.

15. The display device according to claim 13, wherein the signal input unit inputs the square wave signal to the signal input terminal, and a frequency of the square wave signal is consistent with a frequency of the turn-on signal.

16. A method of manufacturing a display panel, wherein the display panel comprises a display substrate, the display substrate comprises a base substrate, the base substrate has a display area and a peripheral area, and the method comprises:

forming a photosensitive thin film transistor structure in the peripheral area, wherein the photosensitive thin film transistor structure comprises a reference thin film transistor unit and a photosensitive thin film transistor unit, the reference thin film transistor unit comprises a plurality of reference thin film transistors, and the photosensitive thin film transistor unit comprises a plurality of photosensitive thin film transistors;

forming a light shielding layer on a side of the photosensitive thin film transistor structure close to a display side of the display panel, wherein an orthographic projection of the reference thin film transistor on the base substrate is located within an orthographic projection of the light shielding layer on the base substrate, at least part of an orthographic projection of a channel region of the photosensitive thin film transistor on the base substrate does not overlap the orthographic projection of the light shielding layer on the base substrate;

connecting a first electrode of the reference thin film transistor and a first electrode of the photosensitive thin film transistor to a signal input terminal of the photosensitive thin film transistor structure; connecting a second electrode of the reference thin film transistor to a second signal line of the photosensitive thin film transistor structure, connecting a second electrode of the photosensitive thin film transistor to a third signal line of the photosensitive thin film transistor structure; connecting a gate electrode of the reference thin film transistor to a first control terminal of the photosensitive thin film transistor structure, connecting a gate electrode of the photosensitive thin film transistor to a second control terminal of the photosensitive thin film transistor structure;

wherein the peripheral area comprises a first peripheral area and a second peripheral area, and the first peripheral area and the second peripheral area are respectively located on opposite sides of the display area, the photosensitive thin film transistor structure is located in the first peripheral area, the first peripheral area is provided with a third connection line, and the second peripheral area is provided with a first terminal, the gate electrode of the reference thin film transistor and the gate electrode of the photosensitive thin film transistor are both connected to the third connection line, the third connection line is connected to a third line in a different layer through a via hole, the third connection line is connected to a fifth connection line in a different layer through a via hole, the fifth connection line extends to the second peripheral area and is connected to the first terminal, and the first terminal is configured to input a control signal to the gate electrode of the reference thin film transistor and the gate electrode of the photosensitive thin film transistor.

17. The method according to claim 16, further comprising:

forming a first light shielding pattern on a side of the reference thin film transistor away from the display side of the display panel, wherein an orthographic projection of an active layer of the reference thin film transistor on the base substrate is located within an orthographic projection of the first light shielding pattern on the base substrate;

forming a second light shielding pattern on a side of the photosensitive thin film transistor away from the display side of the display panel, and wherein an orthographic projection of an active layer of the photosensitive thin film transistor on the base substrate is located within an orthographic projection of the second light shielding pattern on the base substrate.

18. The method according to claim 17, wherein, forming the first light shielding pattern and the gate electrode of the reference thin film transistor through one patterning process;

forming the second light shielding pattern and the gate electrode of the photosensitive thin film transistor by one patterning process.

19. The method according to claim 16, wherein the display area is provided with a thin film transistor for display, and the method comprises:

forming the gate electrode of the reference thin film transistor, the gate electrode of the photosensitive thin film transistor and a gate electrode of the thin film transistor for display by one patterning process;

forming the first electrode of the reference thin film transistor, the first electrode of the photosensitive thin film transistor and a first electrode of the thin film transistor for display by one patterning process;

forming the second electrode of the reference thin film transistor, the second electrode of the photosensitive thin film transistor and a second electrode of the thin film transistor for display by one patterning process.

* * * * *